(12) United States Patent
    Kim

(10) Patent No.: US 11,817,424 B2
(45) Date of Patent: Nov. 14, 2023

(54) SEMICONDUCTOR PACKAGE

(71) Applicant: Samsung Electronics Co., Ltd., Suwon-si (KR)

(72) Inventor: Jung-Hwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/212,332

(22) Filed: Mar. 25, 2021

(65) Prior Publication Data
    US 2022/0037289 A1     Feb. 3, 2022

(30) Foreign Application Priority Data
    Jul. 30, 2020   (KR) .................. 10-2020-0095517

(51) Int. Cl.
    *H01L 25/065*    (2023.01)
    *H01L 23/538*    (2006.01)
    *H01L 23/00*     (2006.01)

(52) U.S. Cl.
    CPC ...... *H01L 25/0657* (2013.01); *H01L 23/5385* (2013.01); *H01L 23/5386* (2013.01); *H01L 24/14* (2013.01)

(58) Field of Classification Search
    CPC ............. H01L 25/0657; H01L 23/5385; H01L 23/5386; H01L 24/14
    See application file for complete search history.

(56) References Cited

U.S. PATENT DOCUMENTS

| | | | |
|---|---|---|---|
| 4,998,665 A | 3/1991 | Hayashi | |
| 5,753,536 A | 5/1998 | Sugiyama et al. | |
| 8,193,023 B2 | 6/2012 | Ahn | |
| 8,617,689 B2 | 12/2013 | Chen et al. | |
| 8,697,493 B2 | 4/2014 | Sadaka | |
| 9,142,517 B2 | 9/2015 | Liu et al. | |
| 10,141,218 B2 | 11/2018 | Tong et al. | |
| 10,411,143 B2 | 9/2019 | Sato | |
| 2012/0306095 A1* | 12/2012 | Han | H01L 23/481 257/774 |
| 2015/0287702 A1* | 10/2015 | Kim | H01L 23/5389 257/686 |
| 2016/0099229 A1* | 4/2016 | Choi | H01L 21/76898 257/737 |
| 2019/0131277 A1 | 5/2019 | Yang et al. | |
| 2020/0135677 A1* | 4/2020 | Chang | H01L 21/56 |

* cited by examiner

*Primary Examiner* — Trang Q Tran
(74) *Attorney, Agent, or Firm* — Muir Patent Law, PLLC

(57) ABSTRACT

A semiconductor package includes a lower semiconductor chip having a first surface and a second surface, an upper semiconductor chip on the first surface, a first insulating layer between the first surface and the upper semiconductor chip, a second insulating layer between the first insulating layer and the upper semiconductor chip, and a connection structure penetrating the first insulating layer and the second insulating layer and being connected to the lower semiconductor chip and the upper semiconductor chip. The connection structure includes a first connecting portion and a second connecting portion, which are respectively disposed in the first insulating layer and the second insulating layer. A width of the second connecting portion is greater than a width of the first connecting portion. A thickness of the second connecting portion is greater than a thickness of the first connecting portion.

18 Claims, 19 Drawing Sheets

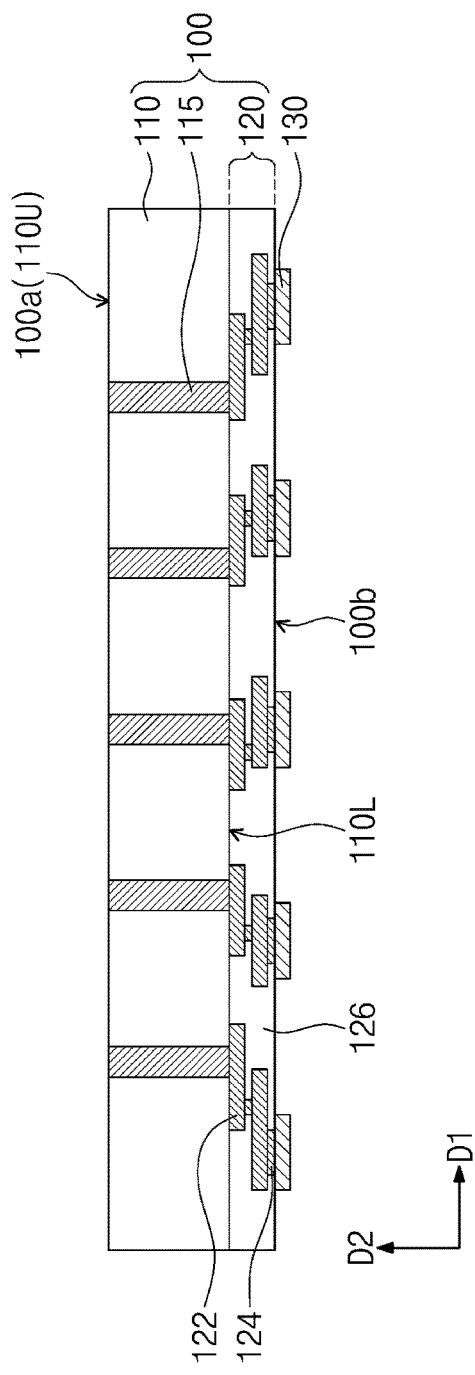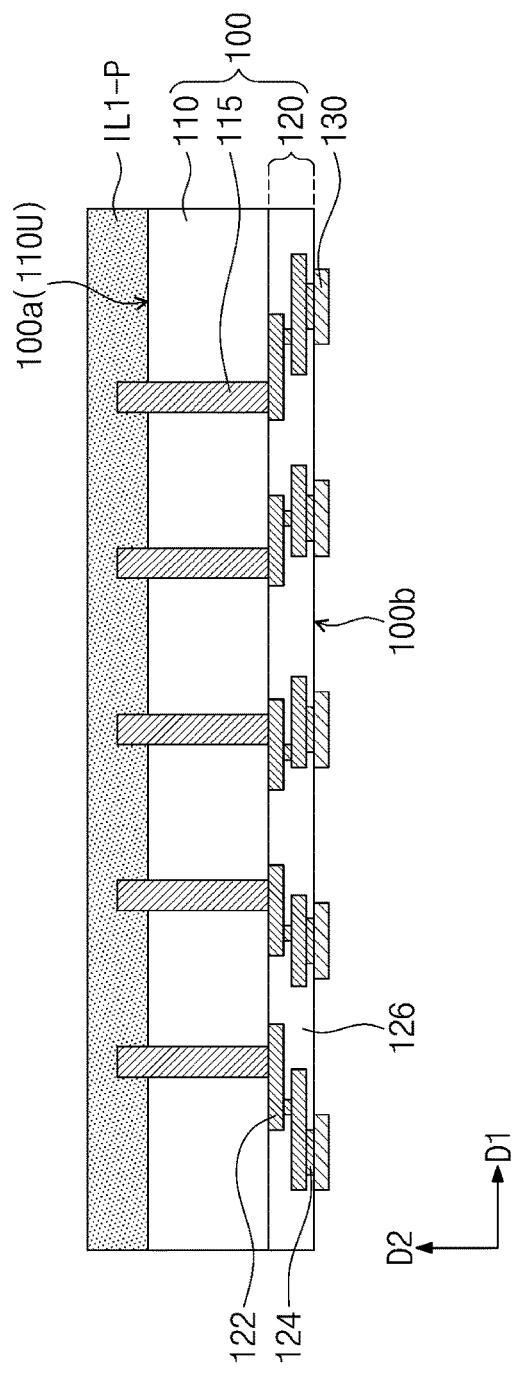

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2020-0095517, filed on Jul. 30, 2020, in the Korean Intellectual Property Office, the entire contents of which are hereby incorporated by reference.

BACKGROUND OF THE INVENTION

The present disclosure relates to a semiconductor package, and in particular, to a semiconductor package on which a plurality of semiconductor chips are mounted.

A semiconductor package may include a semiconductor chip as a part of an electronic product. In general, the semiconductor package includes a printed circuit board (PCB) and a semiconductor chip, which is mounted on the PCB and is electrically connected to the PCB by bonding wires or bumps. With the development of the electronics industry, there is an increasing demand for small, lightweight, and multifunctional electronic devices. To meet this demand, a multi-chip package technology of mounting a plurality of chips in a single semiconductor package or a system-in-package technology of providing chips of different kinds, which are mounted in a single semiconductor package to serve as a single system, have been proposed.

SUMMARY

An embodiment of the inventive concept provides a semiconductor package having an interconnection structure with which interconnection between a plurality of semiconductor chips is easily formed.

An embodiment of the inventive concept provides a semiconductor package having an interconnection structure with which higher integration of a plurality of semiconductor chips is easily achieved.

According to an embodiment of the present inventive concept, a semiconductor package includes a lower semiconductor chip having a first surface and a second surface, which are opposite to each other, an upper semiconductor chip on the first surface of the lower semiconductor chip, a first insulating layer between the first surface of the lower semiconductor chip and the upper semiconductor chip, a second insulating layer between the first insulating layer and the upper semiconductor chip, and a connection structure penetrating the first insulating layer and the second insulating layer and being connected to the lower semiconductor chip and the upper semiconductor chip. The connection structure comprises a first connecting portion and a second connecting portion, which are respectively disposed in the first insulating layer and the second insulating layer. A width of the second connecting portion in a first direction is larger than a width of the first connecting portion in the first direction. A thickness of the second connecting portion in a second direction is larger than a thickness of the first connecting portion in the second direction. The first direction is parallel to the first surface of the lower semiconductor chip and the second direction is perpendicular to the first surface of the lower semiconductor chip.

According to an embodiment of the present inventive concept, a semiconductor package includes a lower semiconductor chip having a first surface and a second surface, which are opposite to each other, a plurality of upper semiconductor chips vertically stacked on the first surface of the lower semiconductor chip, the plurality of upper semiconductor chips comprising a first upper semiconductor chip and a second upper semiconductor chip, which are adjacent to each other, a first insulating layer between the first upper semiconductor chip and the second upper semiconductor chip, a second insulating layer between the first insulating layer and the second upper semiconductor chip, and a connection structure penetrating the first and second insulating layers and being connected to the first and second upper semiconductor chips. The connection structure comprises a first connecting portion in the first insulating layer and a second connecting portion in the second insulating layer. A width, in a first direction, of the second connecting portion is larger than a width, in the first direction, of the first connecting portion. A thickness, in a second direction, of the second connecting portion is larger than a thickness, in the second direction, of the first connecting portion. The first direction is parallel to the first surface of the lower semiconductor chip and the second direction is perpendicular to the first surface of the lower semiconductor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 7 to 11 are sectional views illustrating a method of fabricating a semiconductor package according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
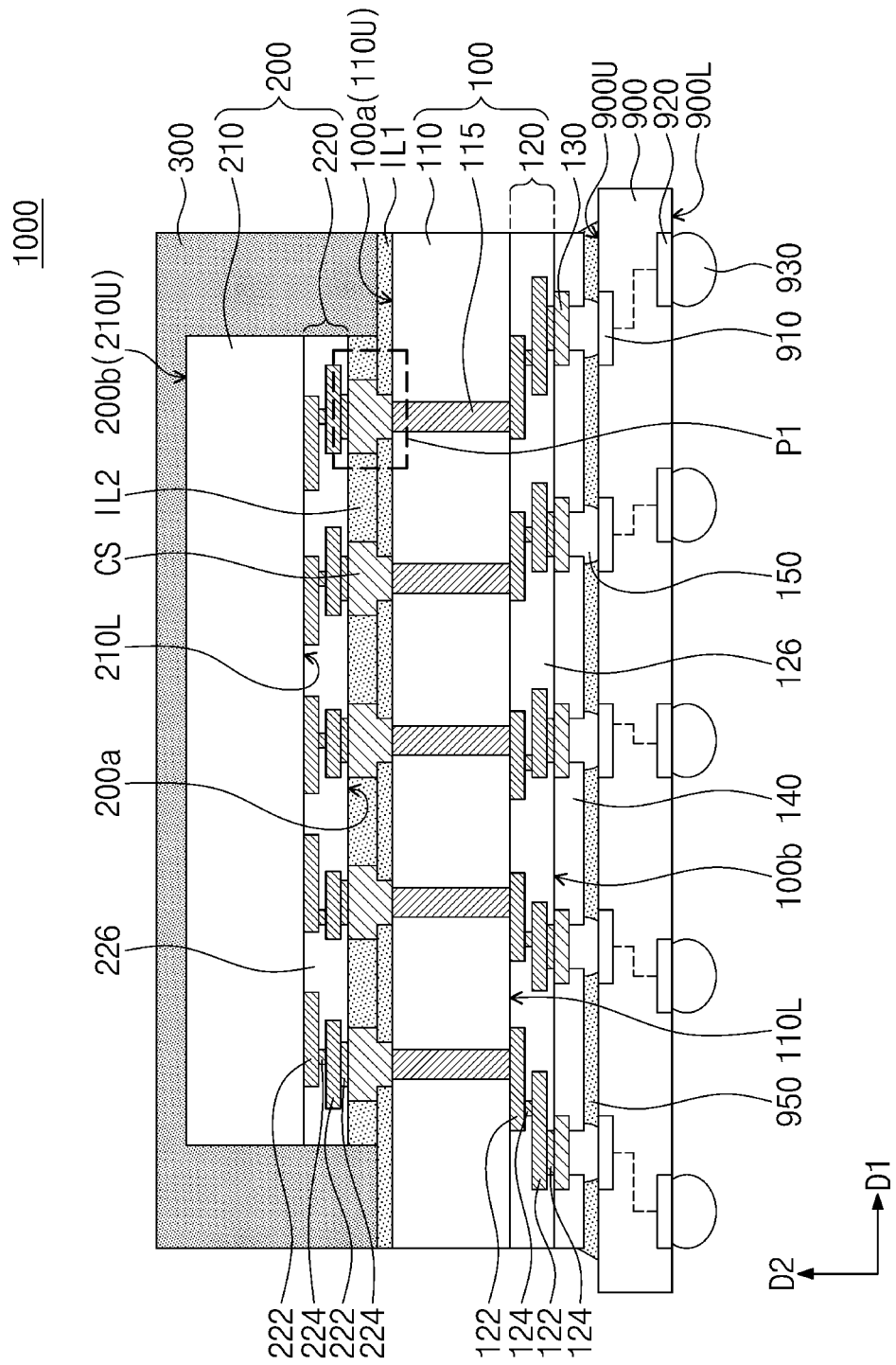
FIG. 1 is a sectional view illustrating a semiconductor package according to an embodiment of the inventive concept.
Figure 2:
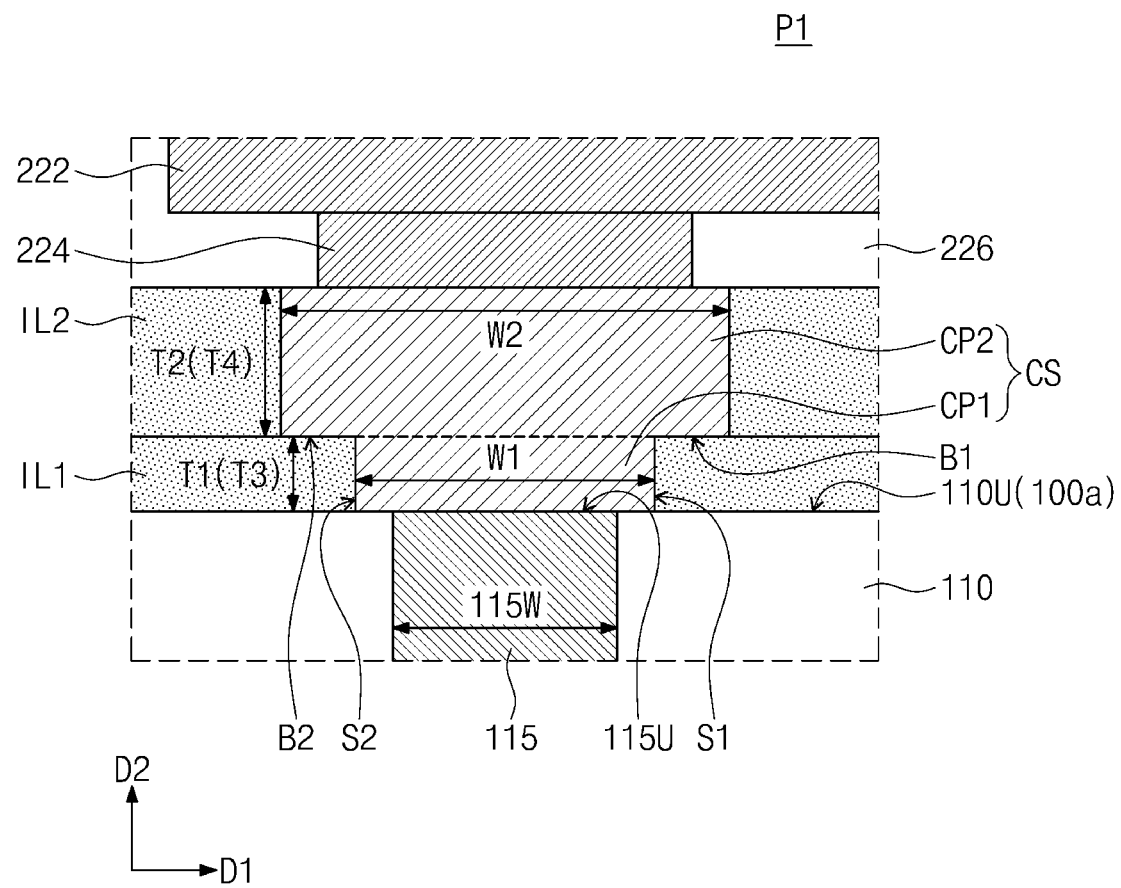
FIG. 2 is an enlarged view illustrating portion P1 of FIG. 1.

FIG. 1 is a sectional view illustrating a semiconductor package according to an embodiment of the inventive concept. FIG. 2 is an enlarged view illustrating portion P1 of FIG. 1.

Referring to FIGS. 1 and 2, a semiconductor package 1000 may include a lower semiconductor chip 100, an upper semiconductor chip 200 on the lower semiconductor chip 100, a first insulating layer IL1 between the lower and upper semiconductor chips 100 and 200, a second insulating layer IL2 between the first insulating layer IL1 and the upper semiconductor chip 200, and a connection structure CS, which penetrates the first and second insulating layers IL1 and IL2 and is connected to the lower and upper semiconductor chips 100 and 200. It will be understood that when an element is referred to as being "connected", or "coupled" to or "on" another element, it can be directly connected, coupled, or bonded to or on the other element or intervening elements may be present. In contrast, when an element is referred to as being "directly connected", or "directly coupled" to another element, or as "contacting" or "in contact with" another element, there are no intervening elements present at the point of contact.

The lower semiconductor chip 100 may include a lower semiconductor substrate 110, a lower circuit layer 120 on a bottom surface 110L of the lower semiconductor substrate 110, and a plurality of lower penetration electrodes 115 penetrating the lower semiconductor substrate 110. The lower semiconductor substrate 110 may be formed of or include at least one of semiconductor materials (e.g., silicon, germanium, or silicon-germanium).

The lower circuit layer 120 may include lower interconnection patterns 122 and 124 and a lower interconnection insulating layer 126 covering the lower interconnection patterns 122 and 124. The lower interconnection patterns 122 and 124 may include line patterns 122 and via patterns 124, which are connected to the line patterns 122. The lower circuit layer 120 may further include integrated circuits (not shown), which are disposed on the bottom surface 110L of the lower semiconductor substrate 110, and the lower interconnection patterns 122 and 124 may be electrically connected to the integrated circuits. The lower interconnection patterns 122 and 124 may be formed of or include at least one of metallic materials (e.g., copper, aluminum, titanium, and/or tungsten), and the lower interconnection insulating layer 126 may be formed of or include at least one of silicon-containing insulating materials (e.g., silicon oxide, silicon nitride, silicon oxynitride, and/or tetraethyl orthosilicate).

Each of the lower penetration electrodes 115 may penetrate the lower semiconductor substrate 110 and may be connected to a corresponding one of the lower interconnection patterns 122 in the lower circuit layer 120. In an embodiment, the lower penetration electrodes 115 may have top surfaces 115U that are substantially coplanar with a top surface 110U of the lower semiconductor substrate 110. As an example, the top surfaces 115U of the lower penetration electrodes 115 may be located at substantially the same height as the top surface 110U of the lower semiconductor substrate 110, when measured from the bottom surface 110L of the lower semiconductor substrate 110. The lower penetration electrodes 115 may be formed of or include at least one of metallic materials (e.g., copper (Cu)). Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The lower semiconductor chip 100 may have a first surface 100a and a second surface 100b, which are opposite to each other. The first surface 100a of the lower semiconductor chip 100 may correspond to the top surface 110U of the lower semiconductor substrate 110, and the lower circuit layer 120 may be adjacent to the second surface 100b of the lower semiconductor chip 100. The lower semiconductor chip 100 may be a memory chip, a logic chip, an application processor (AP) chip, or a system-on-chip (SOC).

Lower chip pads 130 may be disposed on the second surface 100b of the lower semiconductor chip 100. Each of the lower chip pads 130 may be connected to a corresponding one of the lower interconnection patterns 124 in the lower circuit layer 120. The lower chip pads 130 may be formed of or include a material that is different from the lower interconnection patterns 122 and 124. As an example, the lower chip pads 130 may be formed of or include a metallic material (e.g., aluminum).

A buffer layer 140 may be disposed on the second surface 100b of the lower semiconductor chip 100 to cover the second surface 100b of the lower semiconductor chip 100 between the lower chip pads 130. The buffer layer 140 may cover an edge portion of each of the lower chip pads 130 and may expose at least a portion of each of the lower chip pads 130. The buffer layer 140 may be formed of or include at least one of insulating polymers and silicon-based insulating materials.

Bonding bumps 150 may be disposed on the second surface 100b of the lower semiconductor chip 100 and may be disposed on the lower chip pads 130, respectively. Each of the bonding bumps 150 may penetrate the buffer layer 140 and may be connected to a corresponding one of the lower chip pads 130. The bonding bumps 150 may be formed of or include at least one of conductive materials and may be provided in the form of at least one of solder balls, bumps, and pillars.

The upper semiconductor chip 200 may include an upper semiconductor substrate 210 and an upper circuit layer 220, which is disposed on a bottom surface 210L of the upper semiconductor substrate 210. The upper semiconductor substrate 210 may be formed of or include at least one of semiconductor materials (e.g., silicon, germanium, or silicon-germanium).

The upper circuit layer 220 may include upper interconnection patterns 222 and 224 and an upper interconnection insulating layer 226 covering the upper interconnection patterns 222 and 224. The upper interconnection patterns 222 and 224 may include line patterns 222 and via patterns 224, which are connected to the line patterns 222. The upper circuit layer 220 may further include integrated circuits (not shown) disposed on the bottom surface 210L of the upper semiconductor substrate 210, and the upper interconnection patterns 222 and 224 may be electrically connected to the integrated circuits. The upper interconnection patterns 222 and 224 may be formed of or include at least one of metallic materials (e.g., copper, aluminum, titanium, and/or tungsten), and the upper interconnection insulating layer 226 may be formed of or include at least one of silicon-containing insulating materials (e.g., silicon oxide, silicon nitride, silicon oxynitride, and/or tetraethyl orthosilicate).

The upper semiconductor chip 200 may have a third surface 200a and a fourth surface 200b, which are opposite to each other. The upper circuit layer 220 may be adjacent to the third surface 200a of the upper semiconductor chip 200, and the fourth surface 200b of the upper semiconductor chip 200 may correspond to the top surface 210U of the upper semiconductor substrate 210. The upper semiconductor chip 200 may be a memory chip, a logic chip, an application processor (AP) chip, or a system-on-chip (SOC).

The third surface 200a of the upper semiconductor chip 200 may face the first surface 100a of the lower semiconductor chip 100. The first insulating layer IL1, the second insulating layer IL2, and the connection structure CS may be disposed between the first surface 100a of the lower semiconductor chip 100 and the third surface 200a of the upper semiconductor chip 200.

The connection structure CS may include a first connecting portion CP1 and a second connecting portion CP2, which are respectively provided in the first insulating layer IL1 and the second insulating layer IL2. The connection structure CS may have a width, which is defined as a length in a first direction D1 parallel to the first surface 100a of the lower semiconductor chip 100, and a width W2 of the second connecting portion CP2 may be larger than a width W1 of the first connecting portion CP1 (i.e., W2>W1). As an example, the width W1 of the first connecting portion CP1 may have a value from about 1.5 μm to about 3.0 μm, and the width W2 of the second connecting portion CP2 may have a value from about 3.0 μm to about 6.0 μm. The second connecting portion CP2 may be extended onto the first insulating layer IL1 in the first direction D1, and the first insulating layer IL1 may be interposed bottom surfaces B1 and B2 of the second connecting portion CP2 and the first surface 100a of the lower semiconductor chip 100. The first insulating layer IL1 may be in contact with the bottom surfaces B1 and B2 of the second connecting portion CP2 and side surfaces S1 and S2 of the first connecting portion CP1. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first connecting portion CP1 may have the first side surface S1 and the second side surface S2, which are opposite to each other in the first direction D1. The second connecting portion CP2 may protrude from (i.e., extend beyond) the first side surface S1 of the first connecting portion CP1 in the first direction D1 and may protrude from the second side surface S2 of the first connecting portion CP1 in a direction opposite to the first direction D1. As an example, the connection structure CS may have a T-shaped section. The second connecting portion CP2 may have a first bottom surface B1 (i.e., a first portion of a bottom surface of the second connecting portion) and a second bottom surface B2 (i.e., a second portion of the bottom surface of the second connecting portion), which are respectively disposed adjacent to the first and second side surfaces S1 and S2 of the first connecting portion CP1. The first insulating layer IL1 may be interposed between the first bottom surface B1 of the second connecting portion CP2 and the first surface 100a of the lower semiconductor chip 100 and between the second bottom surface B2 of the second connecting portion CP2 and the first surface 100a of the lower semiconductor chip 100. The first insulating layer IL1 may be in contact with the first and second side surfaces S1 and S2 of the first connecting portion CP1 and the first and second bottom surfaces B1 and B2 of the second connecting portion CP2. When viewed in a plan view, the second connecting portion CP2 may protrude from the side surfaces S1 and S2 of the first connecting portion CP1 in a direction parallel to the first surface 100a of the lower semiconductor chip 100.

The connection structure CS may have a thickness, which is defined as a length in a second direction D2 perpendicular to the first surface 100a of the lower semiconductor chip 100, and a thickness T2 of the second connecting portion CP2 may be larger than a thickness T1 of the first connecting portion CP1 (i.e., T2>T1). As an example, the thickness T1 of the first connecting portion CP1 may have a value from about 0.5 μm to about 1.5 μm, and the thickness T2 of the second connecting portion CP2 may have a value from about 1.0 μm to about 3.0 μm. An aspect ratio (A/R) of the connection structure CS may be defined as a ratio of a sum of the thicknesses T1 and T2 of the first and second connecting portions CP1 and CP2 to the width W1 of the first connecting portion CP1 (i.e., $A/R=(T1+T2)/W1$). The aspect ratio of the connection structure CS may have a value from about 0.5 to about 3.0.

The connection structure CS may be formed of or include at least one of conductive materials. The first connecting portion CP1 and the second connecting portion CP2 may be formed of or include the same conductive material. As an example, the first connecting portion CP1 and the second connecting portion CP2 may be formed of or include the same metallic material (e.g., copper).

The first connecting portion CP1 may be connected to a corresponding one of the lower penetration electrodes 115 (e.g., to the lower penetration electrode 115), which are provided in the lower semiconductor chip 100. Each of the lower penetration electrodes 115 may have a width 115W in the first direction D1. In an embodiment, the width W1 of the first connecting portion CP1 may be larger than the width 115W of a corresponding one of the lower penetration electrodes 115. The second connecting portion CP2 may be connected to a corresponding one of the upper interconnection patterns 222 and 224 (e.g., to the upper interconnection pattern 224), which are provided in the upper circuit layer 220 of the upper semiconductor chip 200.

The first insulating layer IL1 may be directly bonded to the second insulating layer IL2. Due to an interfacial bonding between the first and second insulating layers IL1 and IL2, the first insulating layer IL1 may be in contact with the second insulating layer IL2. Each of the first and second insulating layers IL1 and IL2 may have a thickness in the second direction D2, and a thickness T4 of the second insulating layer IL2 may be larger than a thickness T3 of the first insulating layer IL1. The thickness T3 of the first insulating layer IL1 may be substantially equal to the thickness T1 of the first connecting portion CP1, and the thickness T4 of the second insulating layer IL2 may be substantially equal to the thickness T2 of the second connecting portion CP2. In an embodiment, the thickness T3 of the first insulating layer IL1 may have a value from about 0.5 μm to about 1.5 and the thickness T4 of the second insulating layer IL2 may have a value from about 1.0 μm to about 3.0 The first insulating layer IL1 and the second insulating layer IL2 may be formed of or include the same insulating material (e.g., SiCN).

The semiconductor package 1000 may further include a package substrate 900. The package substrate 900 may be disposed on the second surface 100b of the lower semiconductor chip 100. The lower chip pads 130, the buffer layer 140, and the bonding bumps 150 may be disposed between the second surface 100b of the lower semiconductor chip 100 and a top surface 900U of the package substrate 900. First substrate pads 910 may be disposed on the top surface 900U of the package substrate 900, and second substrate pads 920 may be disposed on a bottom surface 900L of the package substrate 900. The first substrate pads 910 and the second substrate pads 920 may be electrically connected to each other through internal interconnections (e.g., depicted by a dotted line) in the package substrate 900. The first and second substrate pads 910 and 920 and the internal interconnections may be formed of or include at least one of metallic materials (e.g., copper, aluminum, tungsten, and/or titanium). The bonding bumps 150 may be connected to the first substrate pads 910. Outer terminals 930 may be disposed on the bottom surface 900L of the package substrate 900 and may be connected to the second substrate pads 920. The outer terminals 930 may be solder balls which may be formed of or include at least one of metallic materials (e.g., tin (Sn), silver (Ag), zinc (Zn), and/or an alloy thereof). The package substrate 900 may be a printed circuit board (PCB), an interposer substrate, or a redistribution substrate including redistribution patterns. In certain embodiments, the package substrate 900 may be an additional semiconductor chip or an additional semiconductor package.

An under-fill layer 950 may be interposed between the package substrate 900 and the buffer layer 140 to fill a space between the bonding bumps 150. The under-fill layer 950 may be formed of or include at least one of insulating polymer materials (e.g., epoxy resin).

A mold layer 300 may be disposed on the first surface 100a of the lower semiconductor chip 100 to cover the upper semiconductor chip 200. In an embodiment, the first insulating layer IL1 may be extended into a region between the first surface 100a of the lower semiconductor chip 100 and the mold layer 300. In certain embodiments, unlike the illustrated structure, the first insulating layer IL1 may be locally interposed between the first surface 100a of the lower semiconductor chip 100 and the third surface 200a of the upper semiconductor chip 200, and the mold layer 300 may be in contact with the first surface 100a of the lower semiconductor chip 100 at both sides of the upper semiconductor chip 200. The mold layer 300 may be formed of or include at least one of insulating materials (e.g., epoxy molding compounds). In an embodiment, the mold layer 300 may be omitted.

Figure 3:
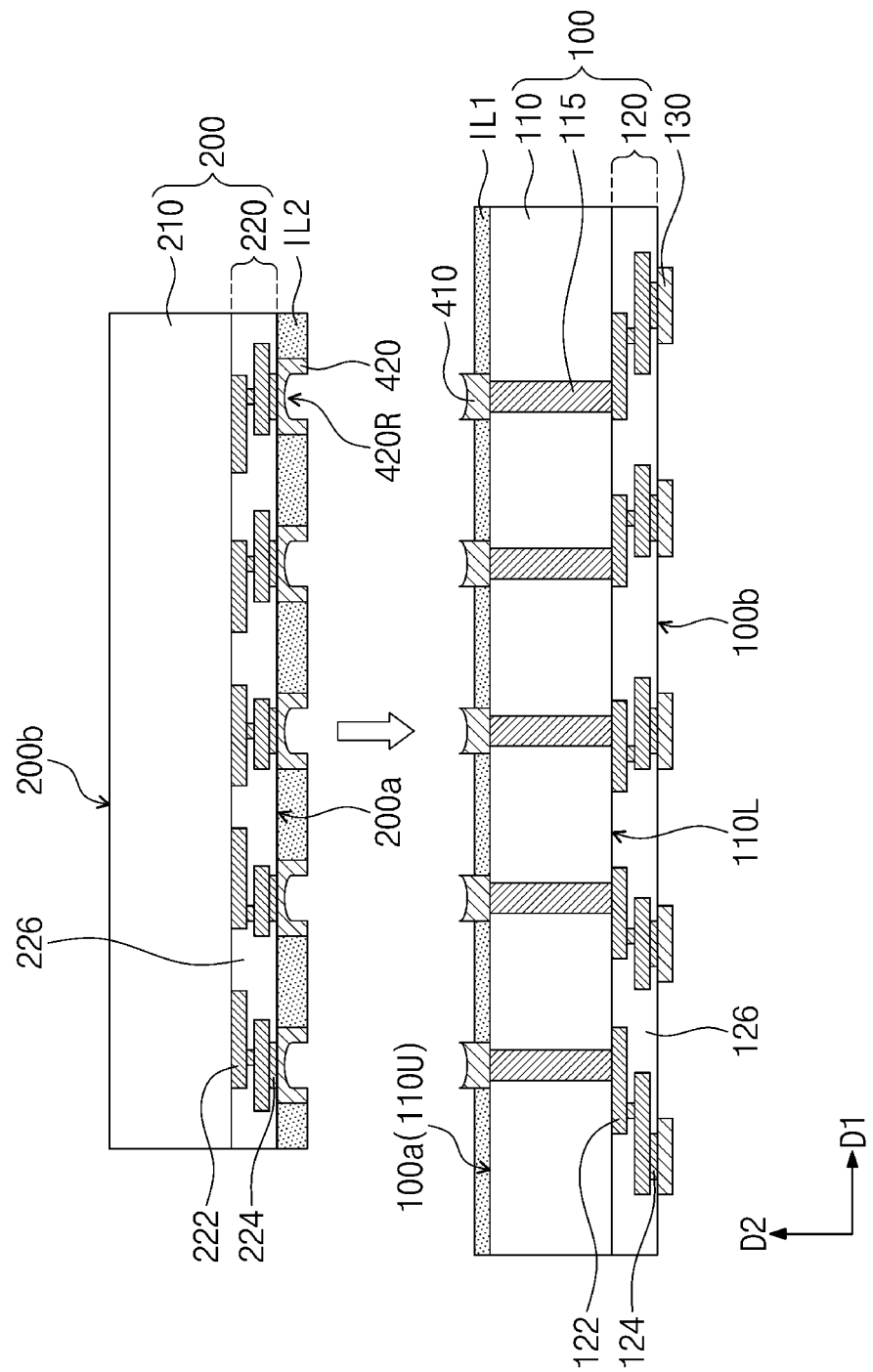
FIGS. 3 and 4 are sectional views illustrating a method of fabricating a semiconductor package according to an embodiment of the inventive concept.
Figure 4:
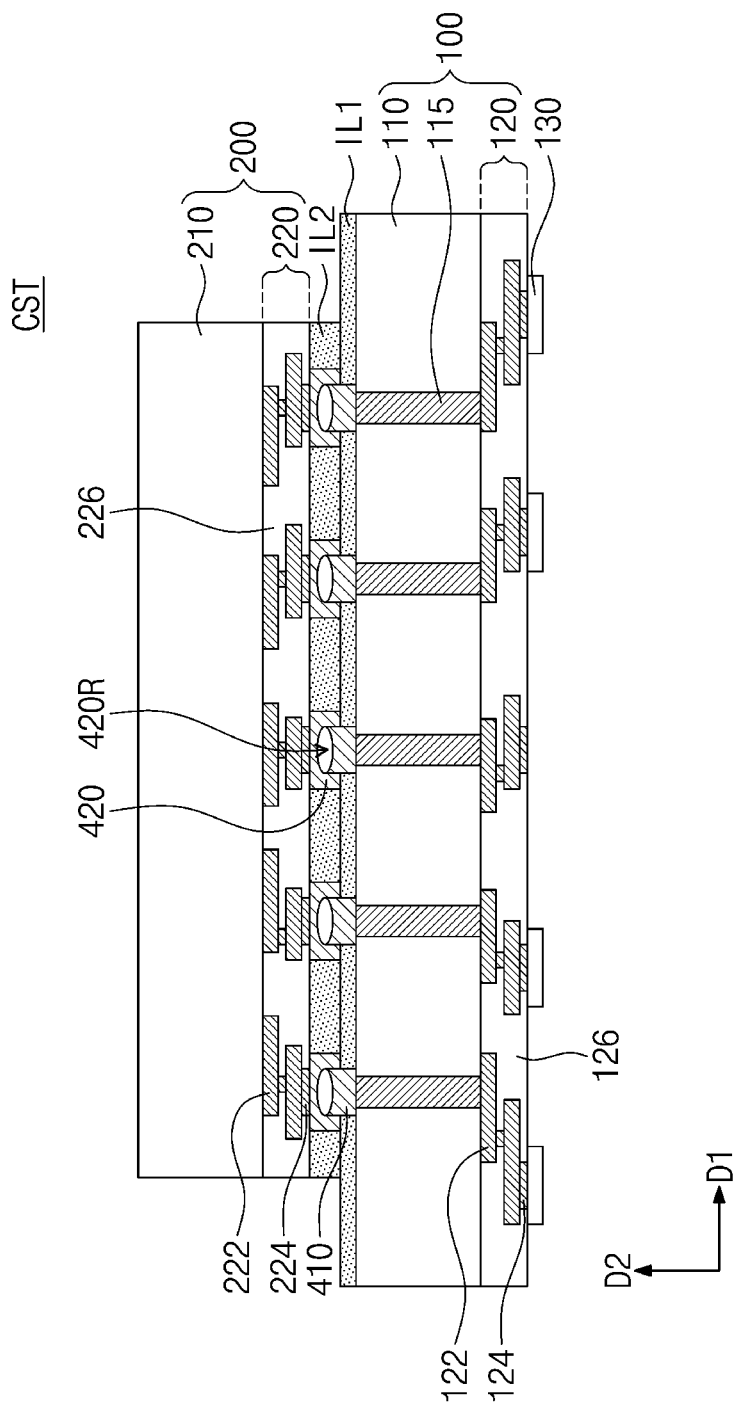

FIGS. 3 and 4 are sectional views illustrating a method of fabricating a semiconductor package according to an embodiment of the inventive concept. For concise description, features overlapped with the semiconductor package 1000 of FIGS. 1 and 2 will be omitted.

Referring to FIG. 3, a lower semiconductor chip 100 may be provided. The lower semiconductor chip 100 may include a lower semiconductor substrate 110, a lower circuit layer 120 on a bottom surface 110L of the lower semiconductor substrate 110, and a plurality of lower penetration electrodes 115 penetrating the lower semiconductor substrate 110. The lower circuit layer 120 may include lower interconnection patterns 122 and 124 and a lower interconnection insulating layer 126 covering the lower interconnection patterns 122 and 124. Each of the lower penetration electrodes 115 may penetrate the lower semiconductor substrate 110 and may be connected to a corresponding one of the lower interconnection patterns 122 and 124 (e.g., the lower interconnection pattern 122), which are provided in the lower circuit layer 120.

The lower semiconductor chip 100 may have a first surface 100a and a second surface 100b, which are opposite to each other. The first surface 100a of the lower semiconductor chip 100 may correspond to the top surface 110U of the lower semiconductor substrate 110, and the lower circuit layer 120 may be adjacent to the second surface 100b of the lower semiconductor chip 100. The lower chip pads 130 may be formed on the second surface 100b of the lower semiconductor chip 100. Each of the lower chip pads 130 may be connected to a corresponding one of the lower interconnection patterns 124 in the lower circuit layer 120.

First connection pads 410 may be formed on the first surface 100a of the lower semiconductor chip 100. Each of the first connection pads 410 may be connected to a corresponding one of the lower penetration electrodes 115. The first connection pads 410 may be formed of or include at least one of metallic materials (e.g., copper) and may be formed by, for example, an electroplating process. A first insulating layer IL1 may be formed on the first surface 100a of the lower semiconductor chip 100 to cover side surfaces of the first connection pads 410. The first insulating layer IL1 may be formed to expose an upper portion of each of the first connection pads 410. The first connection pads 410 may protrude from the first insulating layer IL1 in a second direction D2 perpendicular to the first surface 100a of the lower semiconductor chip 100.

An upper semiconductor chip 200 may be provided. The upper semiconductor chip 200 may include an upper semiconductor substrate 210 and an upper circuit layer 220. The upper circuit layer 220 may include upper interconnection patterns 222 and 224, and an upper interconnection insulating layer 226 covering the upper interconnection patterns 222 and 224. The upper semiconductor chip 200 may have a third surface 200a and a fourth surface 200b, which are opposite to each other. The upper circuit layer 220 may be adjacent to the third surface 200a of the upper semiconductor chip 200.

Second connection pads 420 may be formed on the third surface 200a of the upper semiconductor chip 200. Each of the second connection pads 420 may be connected to a corresponding one of the upper interconnection patterns 222 and 224 in the upper circuit layer 220 (e.g., the upper interconnection pattern 224). The second connection pads 420 may be formed of or include at least one of metallic materials (e.g., copper) and may be formed by, for example, an electroplating process. The first and second connection pads 410 and 420 may be formed of or include the same metal material. Each of the second connection pads 420 may be formed to have a recessed region 420R which is recessed inwardly (i.e., recessed toward the third surface 200a). A second insulating layer IL2 may be formed on the third surface 200a of the upper semiconductor chip 200 to cover side surfaces of the second connection pads 420. The second insulating layer IL2 may be formed to expose the recessed region 420R of each of the second connection pads 420.

The upper semiconductor chip 200 may be disposed on the first surface 100a of the lower semiconductor chip 100. The third surface 200a of the upper semiconductor chip 200 may face the first surface 100a of the lower semiconductor chip 100.

Referring to FIG. 4, the first connection pads 410 may be placed in the recessed regions 420R of the second connection pads 420, respectively. The protruding upper portion of each of the first connection pads 410 may be inserted into the recessed region 420R of a corresponding one of the second connection pads 420. The first insulating layer IL1 may be in contact with the second insulating layer IL2. Thus, a chip stack CST, in which the upper semiconductor chip 200 is stacked on the lower semiconductor chip 100, may be formed.

Referring back to FIGS. 1 and 2, a thermal treatment process may be performed on the chip stack CST. As a result of the thermal treatment process, the first and second connection pads 410 and 420 may be thermally expanded such that an upper surface of the first connection pad 410 and a recessed surface of the second connection pad 420 are connected with each other, and metallic elements (e.g., copper) of the first and second connection pads 410 and 420 may be diffused to form a Cu-to-Cu bonding between the first and second connection pads 410 and 420. Thus, the recessed regions 420R of the second connection pads 420 may be filled with the first and second connection pads 410 and 420. The first and second connection pads 410 and 420 may be bonded to each other by the thermal treatment process and may be in contact with each other without an interface therebetween. The first and second connection pads 410 and 420 may be directly bonded to each other to form a single object (or a unitary body), which will be referred to as connection structure CS. The first and second insulating layers IL1 and IL2 may be directly bonded to each other by the thermal treatment process.

A mold layer 300 may be formed on the first surface 100a of the lower semiconductor chip 100 to cover the upper semiconductor chip 200. A buffer layer 140 may be formed on the second surface 100b of the lower semiconductor chip 100. The buffer layer 140 may be formed to cover the second surface 100b of the lower semiconductor chip 100 between the lower chip pads 130 and to expose at least a portion of each of the lower chip pads 130. Bonding bumps 150 may be formed on the second surface 100b of the lower semiconductor chip 100 to be connected to the lower chip pads 130, respectively. Each of the bonding bumps 150 may penetrate the buffer layer 140 and may be connected to a corresponding one of the lower chip pads 130.

The chip stack CST may be mounted on a package substrate 900. The bonding bumps 150 may be connected to first substrate pads 910 of the package substrate 900. An under-fill layer 950 may be formed between the package substrate 900 and the buffer layer 140 to fill a space between the bonding bumps 150.

According to an embodiment of the inventive concept, each of the first connection pads 410 may be formed to protrude from the first insulating layer ILL and each of the second connection pads 420 may be formed to have a recessed region 420R, which is recessed inwardly. The lower and upper semiconductor chips 100 and 200 may be stacked in such a way that the protruding upper portion of each of the first connection pads 410 is inserted into the recessed region 420R of a corresponding one of the second connection pads 420. A contact area between the first and second connection pads 410 and 420 may be increased, and thus, the thermal expansion of the first and second connection pads 410 and 420 may be increased during the thermal treatment process for a direct bonding between the first and second connection pads 410 and 420. Thus, it may be possible to easily form the connection structure CS for interconnection between the lower and upper semiconductor chips 100 and 200.

Accordingly, it may be possible to provide a semiconductor package, in which a plurality of semiconductor chips may be connected to each other using a Cu-to-Cu bonding, and in which higher integration may be easily achieved.

Figure 5:
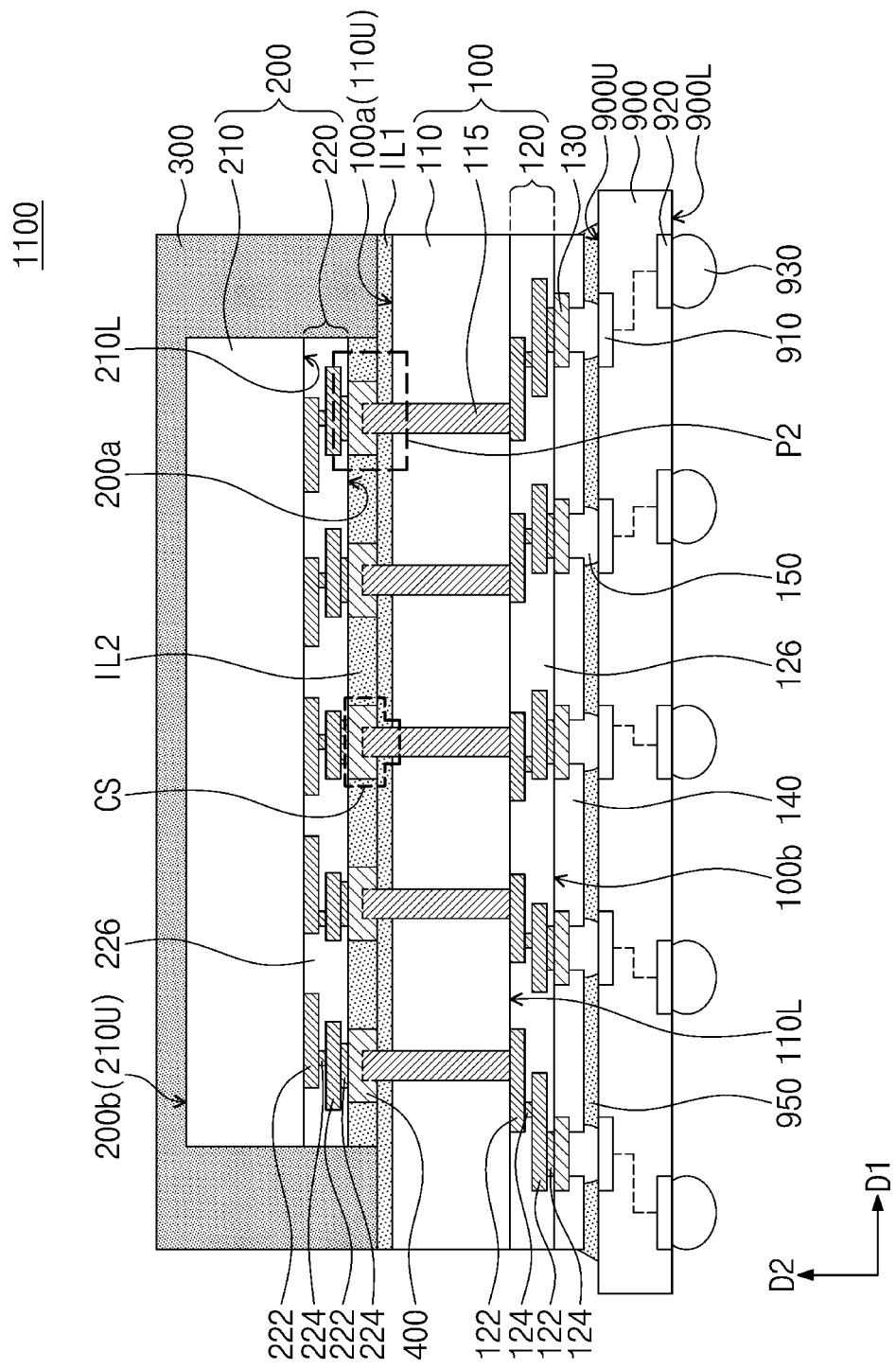
FIG. 5 is a sectional view illustrating a semiconductor package according to an embodiment of the inventive concept.
Figure 6:
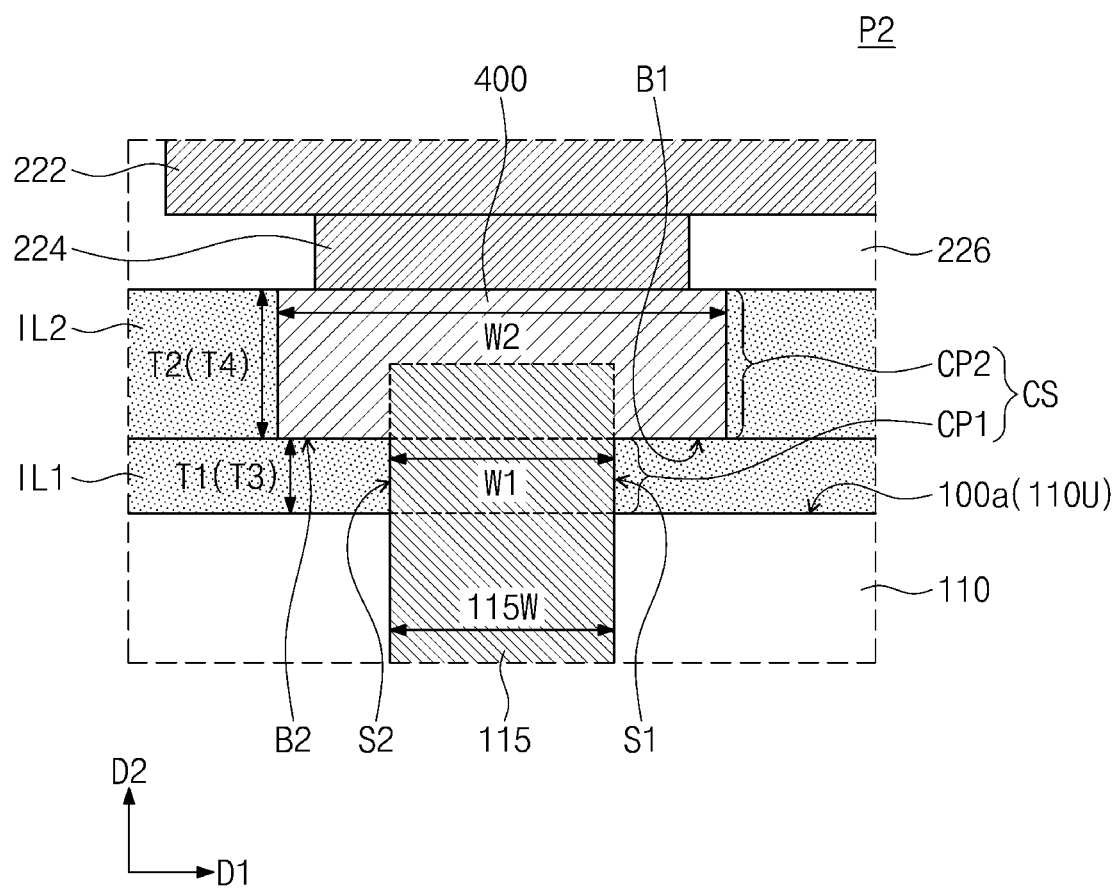
FIG. 6 is an enlarged view illustrating portion P2 of FIG. 5.

FIG. 5 is a sectional view illustrating a semiconductor package according to an embodiment of the inventive concept. FIG. 6 is an enlarged view illustrating portion P2 of FIG. 5. For concise description, features different from the semiconductor package 1000 of FIGS. 1 and 2 will be mainly described.

Referring to FIGS. 5 and 6, a semiconductor package 1100 may include a connection structure CS, which is provided to penetrate a first insulating layer IL1 and a second insulating layer IL2 and is connected to a lower semiconductor chip 100 and an upper semiconductor chip 200.

The lower semiconductor chip 100 may include a lower semiconductor substrate 110, a lower circuit layer 120 on a bottom surface 110L of the lower semiconductor substrate 110, and a plurality of lower penetration electrodes 115 penetrating the lower semiconductor substrate 110. Each of the lower penetration electrodes 115 may penetrate the lower semiconductor substrate 110 and may be connected to a corresponding one of lower interconnection patterns 122 and 124 (e.g., to the lower interconnection pattern 122), which are provided in the lower circuit layer 120. The lower semiconductor chip 100 may have a first surface 100a and a second surface 100b, which are opposite to each other. The first surface 100a of the lower semiconductor chip 100 may correspond to a top surface 110U of the lower semiconductor substrate 110, and the lower circuit layer 120 may be adjacent to the second surface 100b of the lower semiconductor chip 100. In an embodiment, each of the lower penetration electrodes 115 may be extended in a second direction D2, which is perpendicular to the first surface 100a of the lower semiconductor chip 100, and may protrude from the first surface 100a of the lower semiconductor chip 100. The protruding portion of each of the lower penetration electrodes 115 may penetrate the first insulating layer IL1.

The upper semiconductor chip 200 may include an upper semiconductor substrate 210 and an upper circuit layer 220, which is provided on a bottom surface 210L of the upper semiconductor substrate 210. The upper semiconductor chip 200 may have a third surface 200a and a fourth surface 200b, which are opposite to each other. The upper circuit layer 220 may be adjacent to the third surface 200a of the upper semiconductor chip 200, and the fourth surface 200b of the upper semiconductor chip 200 may correspond to a top surface 210U of the upper semiconductor substrate 210. The third surface 200a of the upper semiconductor chip 200 may face the first surface 100a of the lower semiconductor chip 100. In an embodiment, connection pads 400 may be disposed on the third surface 200a of the upper semiconductor chip 200 and in the second insulating layer IL2. Each of the connection pads 400 may be connected to a corresponding one of upper interconnection patterns 222 and 224 (e.g., to the upper interconnection pattern 224), which are provided in the upper circuit layer 220. The connection pads 400 may be formed of or include at least one of metallic materials (e.g., copper).

In an embodiment, the lower penetration electrodes 115 may be directly connected to the connection pads 400. The protruding portion of each of the lower penetration electrodes 115 may penetrate the first insulating layer IL1 and may be extended into a corresponding one of the connection pads 400. The protruding portion of each of the lower penetration electrodes 115 may be in contact with the corresponding connection pad 400. In an embodiment, unlike the illustrated structure, the protruding portion of each of the lower penetration electrodes 115 and the corresponding connection pad 400 may be bonded to each other, without any interface therebetween, thereby forming a single object (or a unitary body). The protruding portion of each of the lower penetration electrodes 115 and the corresponding connection pad 400 may be collectively referred to as the connection structure CS.

The connection structure CS may include a first connecting portion CP1 and a second connecting portion CP2, which are respectively provided in the first insulating layer IL1 and the second insulating layer IL2. In an embodiment, the first connecting portion CP1 may include a portion of the protruding portion of each of the lower penetration electrodes 115. The second connecting portion CP2 may include the corresponding connection pad 400 and the remaining portion of the protruding portion of each of the lower penetration electrodes 115. The connection structure CS may have a width, which is defined as a length in a first direction D1 parallel to the first surface 100a of the lower semiconductor chip 100, and a width W2 of the second connecting portion CP2 may be larger than a width W1 of the first connecting portion CP1 (i.e., W2>W1). In an embodiment, the width W1 of the first connecting portion CP1 may be substantially equal to a width 115W of a corresponding one of the lower penetration electrodes 115. Except for the afore-described features, the connection structure CS in the present embodiment may be substantially the same as the connection structure CS described with reference to FIGS. 1 and 2.

FIGS. 7 to 11 are sectional views illustrating a method of fabricating a semiconductor package according to an embodiment of the inventive concept. For concise description, features different from the method described with reference to FIGS. 1 to 4 will be mainly described.

Referring to FIG. 7, a lower semiconductor chip 100 may be provided. The lower semiconductor chip 100 may include a lower semiconductor substrate 110, a lower circuit layer 120 on a bottom surface 110L of the lower semiconductor substrate 110, and a plurality of lower penetration electrodes 115 penetrating the lower semiconductor substrate 110. Each of the lower penetration electrodes 115 may penetrate the lower semiconductor substrate 110 and may be connected to a corresponding one of lower interconnection patterns 122 in the lower circuit layer 120.

The lower semiconductor chip 100 may have a first surface 100a and a second surface 100b, which are opposite to each other. The first surface 100a of the lower semiconductor chip 100 may correspond to a top surface 110U of the lower semiconductor substrate 110, and the lower circuit layer 120 may be adjacent to the second surface 100b of the lower semiconductor chip 100. Lower chip pads 130 may be formed on the second surface 100b of the lower semiconductor chip 100. Each of the lower chip pads 130 may be connected to a corresponding one of lower interconnection patterns 124 in the lower circuit layer 120.

Referring to FIG. 8, a first etching process may be performed on the first surface 100a of the lower semiconductor chip 100. In an embodiment, the first etching process may be performed to selectively etch a portion of the lower semiconductor substrate 110, and thus, a portion of each of the lower penetration electrodes 115 may protrude from the first surface 100a of the lower semiconductor chip 100. A preliminary first insulating layer IL1-P may be formed on the first surface 100a of the lower semiconductor chip 100 to cover the protruding portion of each of the lower penetration electrodes 115.

Figure 9:
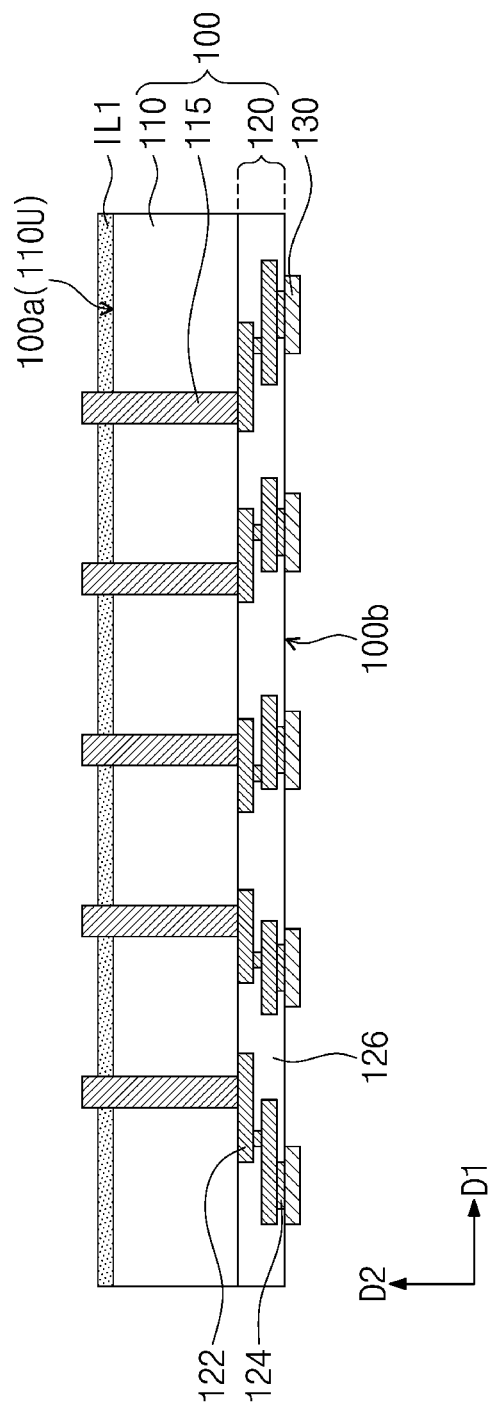

Referring to FIG. 9, a second etching process may be performed on the first surface 100a of the lower semiconductor chip 100. In an embodiment, the second etching process may be performed to selectively etch a portion of the preliminary first insulating layer IL1-P to form a first insulating layer IL1, and thus, a portion of each of the lower penetration electrodes 115 may protrude upwardly from the first insulating layer IL1.

Figure 10:
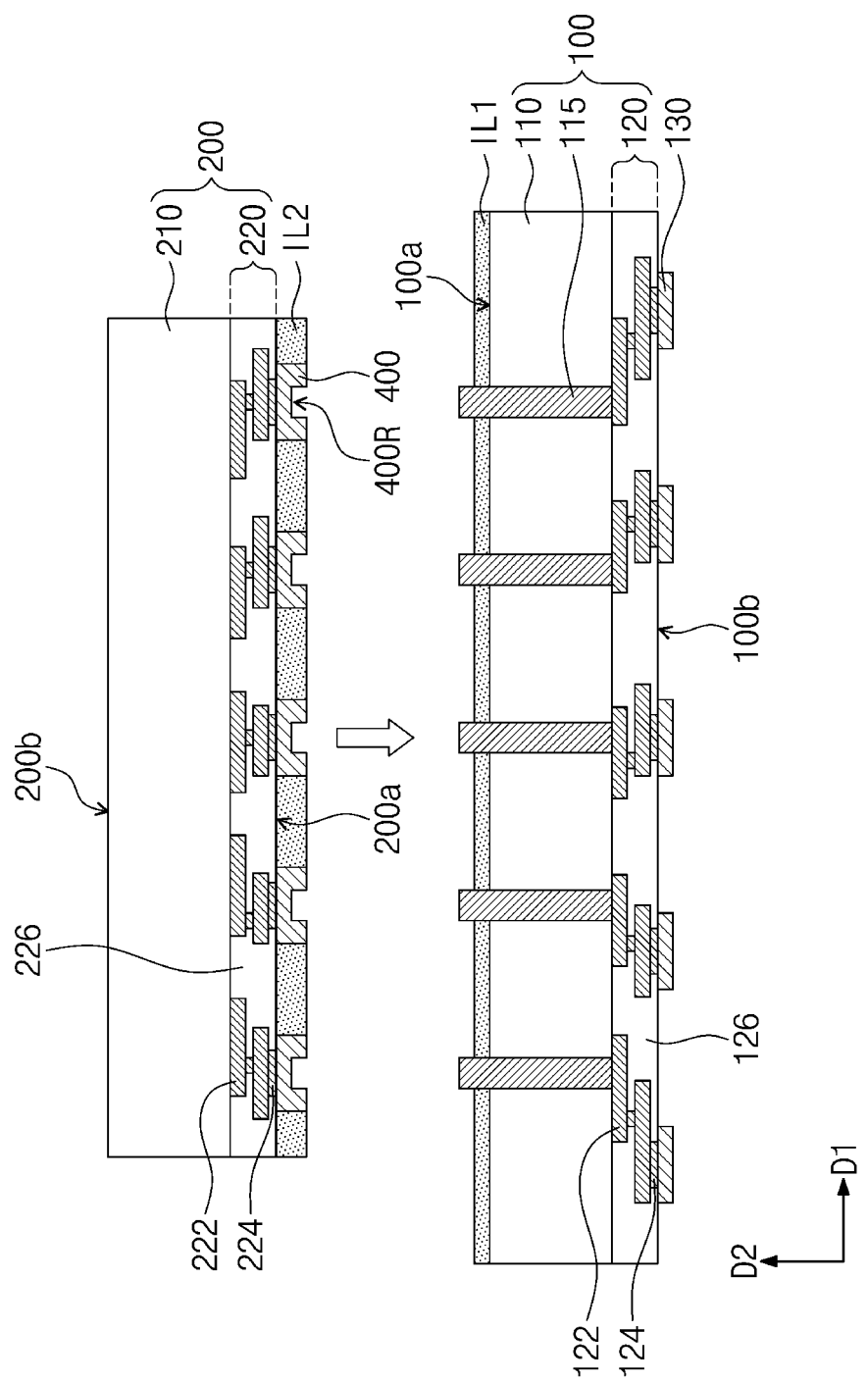

Referring to FIG. 10, an upper semiconductor chip 200 may be provided. The upper semiconductor chip 200 may include an upper semiconductor substrate 210 and an upper circuit layer 220. The upper semiconductor chip 200 may have a third surface 200a and a fourth surface 200b, which are opposite to each other. The upper circuit layer 220 may be adjacent to the third surface 200a of the upper semiconductor chip 200.

Connection pads 400 may be formed on the third surface 200a of the upper semiconductor chip 200. Each of the connection pads 400 may be connected to a corresponding one of upper interconnection patterns 222 and 224 (e.g., to the upper interconnection pattern 224), which are provided in the upper circuit layer 220. The connection pads 400 may be formed of or include at least one of metallic materials (e.g., copper) and may be formed by, for example, an electroplating process. Each of the connection pads 400 may be formed to have a recessed region 400R, which is recessed inwardly. A second insulating layer IL2 may be formed on the third surface 200a of the upper semiconductor chip 200 to cover side surfaces of the connection pads 400. The second insulating layer IL2 may expose the recessed region 400R of each of the connection pads 400.

The upper semiconductor chip 200 may be disposed on the first surface 100a of the lower semiconductor chip 100. The third surface 200a of the upper semiconductor chip 200 may face the first surface 100a of the lower semiconductor chip 100.

Figure 11:
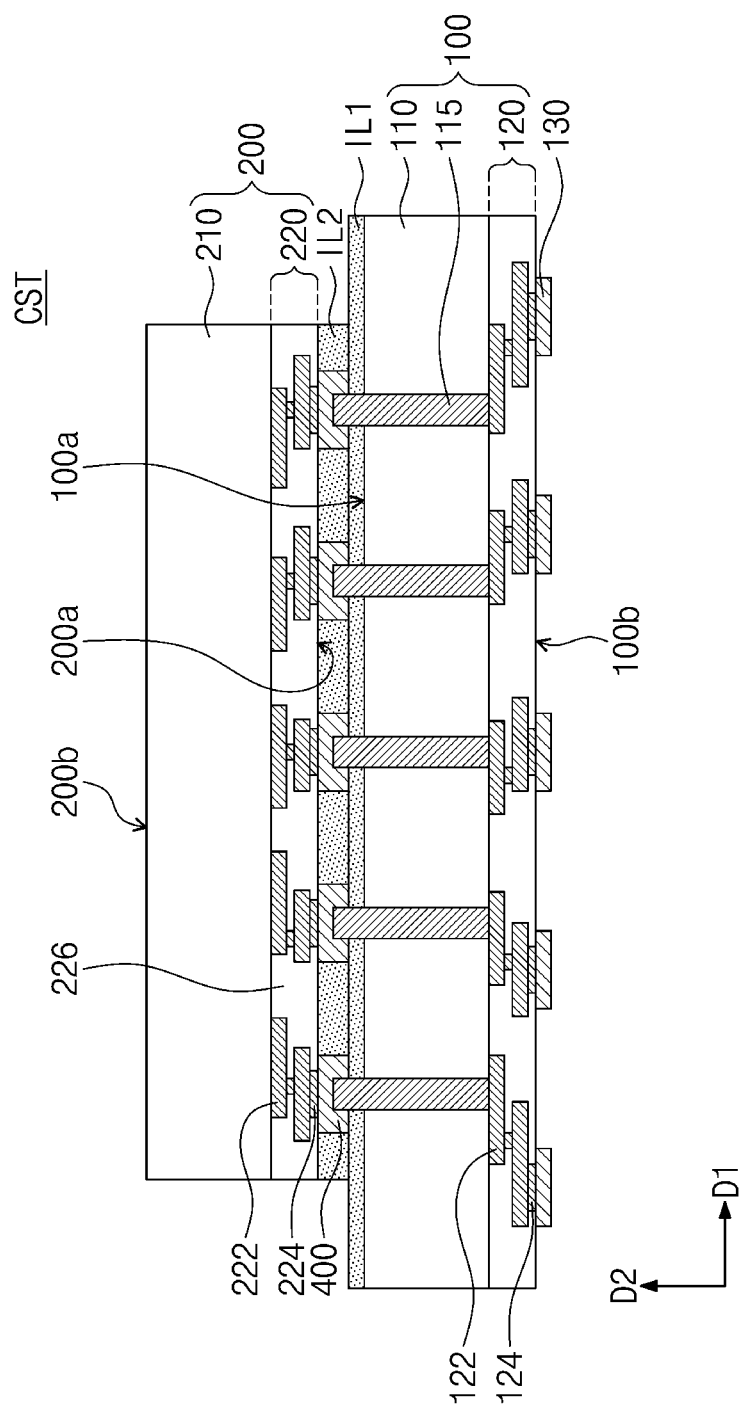

Referring to FIG. 11, the protruding portion of each of the lower penetration electrodes 115 may be inserted into the recessed region 400R of a corresponding one of the connection pads 400. The first insulating layer IL1 may be in contact with the connection pads 400 and the second insulating layer IL2. Thus, a chip stack CST, in which the upper semiconductor chip 200 is stacked on the lower semiconductor chip 100, may be formed.

Referring back to FIGS. 5 and 6, a thermal treatment process may be performed on the chip stack CST. As a result of the thermal treatment process, the protruding portions of the lower penetration electrodes 115 and the connection pads 400 may be thermally expanded, and thus, the lower penetration electrodes 115 and the connection pads 400 may be directly bonded to each other. The protruding portion of each of the lower penetration electrodes 115 may be directly bonded to a corresponding one of the connection pads 400. The protruding portion of each of the lower penetration electrodes 115 and the corresponding connection pad 400 may be collectively referred to as a connection structure CS. The first and second insulating layers IL1 and IL2 may be directly bonded to each other by the thermal treatment process.

According to an embodiment of the inventive concept, each of the lower penetration electrodes 115 may be formed to protrude from the first insulating layer ILL and each of the connection pads 400 may be formed to include a recessed region 400R, which is recessed inwardly. The lower and upper semiconductor chips 100 and 200 may be stacked in such a way that the protruding portion of each of the lower penetration electrodes 115 is inserted into the recessed region 400R of a corresponding one of the connection pads 400. The lower penetration electrodes 115 and the connection pads 400 may be directly bonded to each other by the thermal treatment process, and it may be unnecessary to form additional conductive pads between the lower penetration electrodes 115 and the connection pads 400. Thus, it may be possible to easily form the connection structure CS for interconnection between the lower and upper semiconductor chips 100 and 200.

Figure 12:
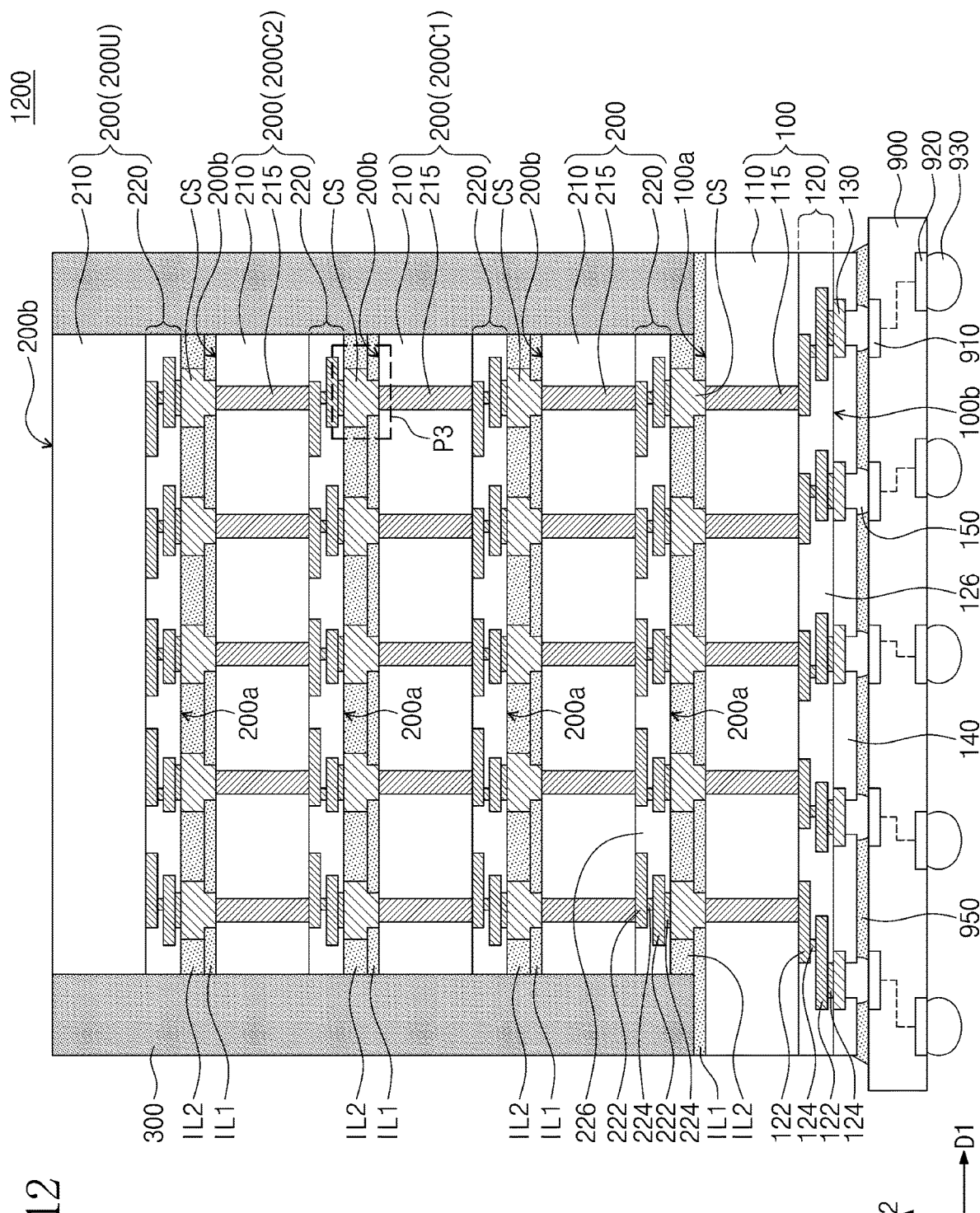
FIG. 12 is a sectional view illustrating a semiconductor package according to an embodiment of the inventive concept.
Figure 13:
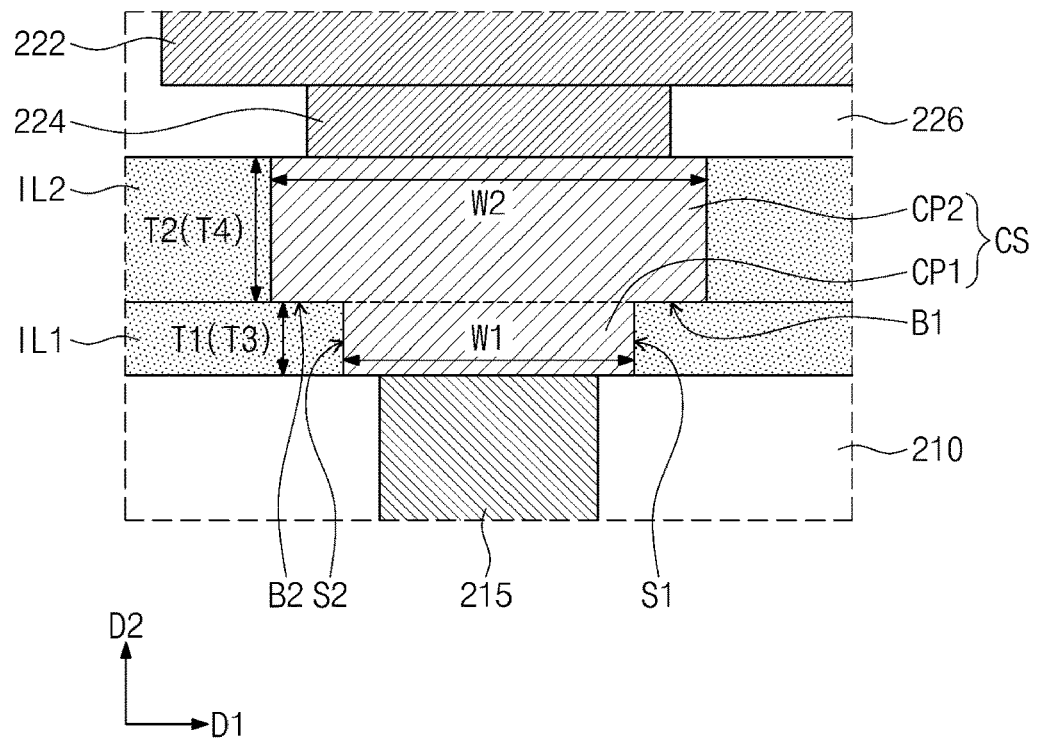
FIG. 13 is an enlarged view illustrating portion P3 of FIG. 12.

FIG. 12 is a sectional view illustrating a semiconductor package according to an embodiment of the inventive concept. FIG. 13 is an enlarged view illustrating portion P3 of FIG. 12. For concise description, features different from the semiconductor package 1000 previously described with reference to FIGS. 1 and 2 will be mainly described.

Referring to FIGS. 12 and 13, a semiconductor package 1200 may include a plurality of upper semiconductor chips 200, which are vertically stacked on a first surface 100a of a lower semiconductor chip 100. The connection structure CS described with reference to FIGS. 1 and 2 may be disposed between the lowermost one of the upper semiconductor chips 200 and the lower semiconductor chip 100, and between the upper semiconductor chips 200.

Each of the upper semiconductor chips 200 may include an upper semiconductor substrate 210 and an upper circuit layer 220. Each of the upper semiconductor chips 200 may have a third surface 200a and a fourth surface 200b, which are opposite to each other, and the upper circuit layer 220 may be adjacent to the third surface 200a of each of the upper semiconductor chips 200. Adjacent ones of the upper semiconductor chips 200 may be stacked in such a way that the third surface 200a of one of the adjacent upper semiconductor chips 200 faces the fourth surface 200b of the other of the adjacent upper semiconductor chips 200. The third surface 200a of the lowermost one of the upper semiconductor chips 200 may face the first surface 100a of the lower semiconductor chip 100.

Each of the upper semiconductor chips 200 may further include upper penetration electrodes 215 penetrating the upper semiconductor substrate 210. In an embodiment, the topmost one (e.g., 200U) of the upper semiconductor chips 200 may be different from the others of the upper semiconductor chips 200, in that the topmost upper semiconductor chip 200U does not include the upper penetration electrodes 215, as illustrated in the drawings. The present invention is not limited thereto. For example, the topmost upper semiconductor chip 200U may be the same as the others of the upper semiconductor chips 200 to include the upper penetration electrodes 215. An end of each of the upper penetration electrodes 215 may be connected to a corresponding one of upper interconnection patterns 222 and 224 in the upper circuit layer 220 (e.g., to the upper interconnection pattern 222), and an opposite end of each of the upper penetration electrodes 215 may be connected to the connection structure CS.

The upper semiconductor chips 200 may include a first upper semiconductor chip 200C1 and a second upper semiconductor chip 200C2, which are adjacent to each other. The fourth surface 200b of the first upper semiconductor chip 200C1 may face the third surface 200a of the second upper semiconductor chip 200C2. A first insulating layer IL1 may be interposed between the first upper semiconductor chip 200C1 and the second upper semiconductor chip 200C2, and a second insulating layer IL2 may be interposed between the first insulating layer IL1 and the second upper semiconductor chip 200C2. The connection structure CS may penetrate the first and second insulating layers IL1 and IL2 to connect the first and second upper semiconductor chips 200C1 and 200C2 to each other.

The connection structure CS may include a first connecting portion CP1 and a second connecting portion CP2, which are respectively provided in the first insulating layer IL1 and the second insulating layer IL2. In an embodiment, the first connecting portion CP1 may be connected to a corresponding one of the upper penetration electrodes 215 (e.g., to the upper penetration electrode 215), which are provided in the first upper semiconductor chip 200C1, and the second connecting portion CP2 may be connected to a corresponding one of the upper interconnection patterns 222 and 224 (e.g., to the upper interconnection pattern 224), which are provided in the upper circuit layer 220 of the second upper semiconductor chip 200C2. Except for the afore-described features, the first and second insulating layers IL1 and IL2 and the connection structure CS in the present embodiment may be substantially the same as the first and second insulating layers IL1 and IL2 and the connection structure CS described with reference to FIGS. 1 and 2.

Figure 14:
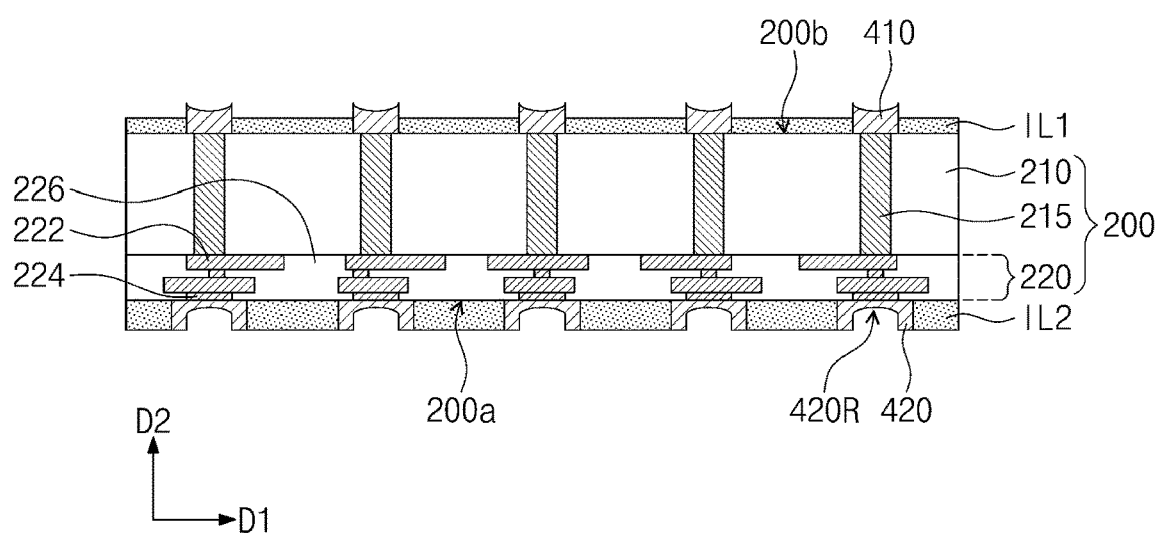
FIGS. 14 and 15 are sectional views illustrating a method of fabricating of a semiconductor package according to an embodiment of the inventive concept.
Figure 15:
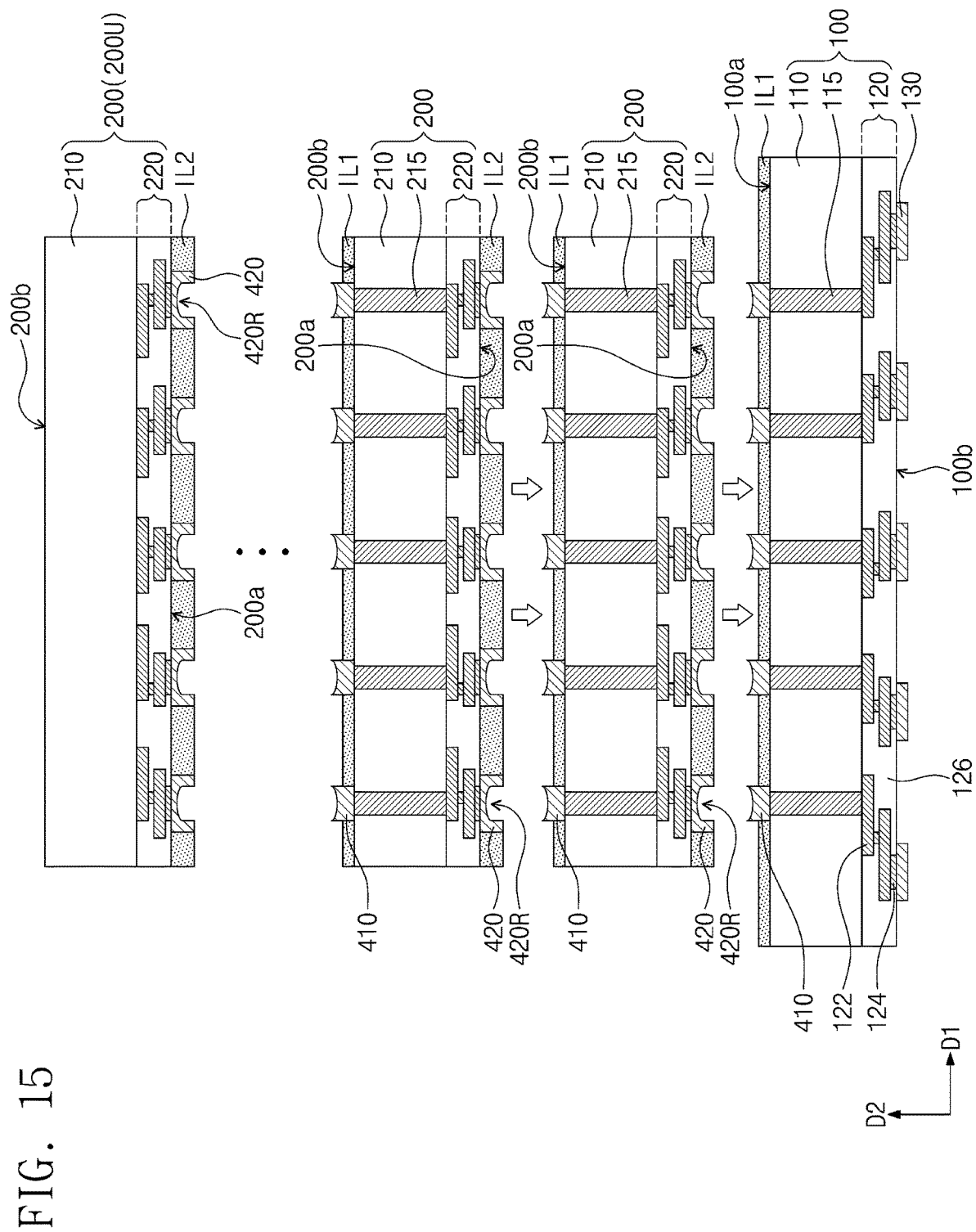

FIGS. 14 and 15 are sectional views illustrating a method of fabricating of a semiconductor package according to an embodiment of the inventive concept. For concise description, features different from the method described with reference to FIGS. 1 to 4 will be mainly described.

Referring to FIG. 14, an upper semiconductor chip 200 may be provided. The upper semiconductor chip 200 may include an upper semiconductor substrate 210, upper penetration electrodes 215 penetrating the upper semiconductor substrate 210, and an upper circuit layer 220. Each of the upper penetration electrodes 215 may be connected to a corresponding one of upper interconnection patterns 222 and 224 in the upper circuit layer 220 (e.g., to the upper interconnection pattern 224). The upper semiconductor chip 200 may have a third surface 200a and a fourth surface 200b, which are opposite to each other. The upper circuit layer 220 may be adjacent to the third surface 200a of the upper semiconductor chip 200.

First connection pads 410 may be formed on the fourth surface 200b of the upper semiconductor chip 200. Each of the first connection pads 410 may be connected to a corresponding one of the upper penetration electrodes 215. A first insulating layer IL1 may be formed on the fourth surface 200b of the upper semiconductor chip 200 to cover side surfaces of the first connection pads 410. The first insulating layer IL1 may be formed to expose an upper portion of each of the first connection pads 410. The first connection pads 410 may protrude from the first insulating layer IL1 in a direction perpendicular to the third surface 200a of the upper semiconductor chip 200 (e.g., in a second direction D2).

Second connection pads 420 may be formed on the third surface 200a of the upper semiconductor chip 200. Each of the second connection pads 420 may be connected to a corresponding one of the upper interconnection patterns 222 and 224 in the upper circuit layer 220 (e.g., the upper interconnection pattern 224). Each of the second connection pads 420 may be formed to have a recessed region 420R which is recessed inwardly. A second insulating layer IL2 may be formed on the third surface 200a of the upper semiconductor chip 200 to cover side surfaces of the second connection pads 420. The second insulating layer IL2 may be formed to expose the recessed region 420R of each of the second connection pads 420.

Referring to FIG. 15, a lower semiconductor chip 100 may be provided. The lower semiconductor chip 100 may be formed by substantially the same method as described with reference to FIG. 3. The upper semiconductor chip 200 of FIG. 14 may be provided in plural, and the upper semiconductor chips 200 may be vertically stacked on a first surface 100a of the lower semiconductor chip 100. The upper semiconductor chips 200 may be stacked in such a way that the first connection pads 410 of each upper semiconductor chip 200 are respectively inserted into the recessed regions 420R of the second connection pads 420 of another of the upper semiconductor chips 200 adjacent thereto. The first connection pads 410, which are formed on the first surface 100a of the lower semiconductor chip 100, may be respectively inserted into the recessed regions 420R of the second connection pads 420 of the lowermost one of the upper semiconductor chips 200.

In an embodiment, the topmost one (e.g., 200U) of the upper semiconductor chips 200 may be different from the others of the upper semiconductor chips 200, in that the topmost upper semiconductor chip 200U does not include the upper penetration electrodes 215. The first insulating layer IL1 and the first connection pads 410 are not formed on the fourth surface 200b of the topmost upper semiconductor chip 200U. The present invention is not limited thereto. For example, the topmost upper semiconductor chip 200U may be the same as the others of the upper semiconductor chips 200 to include the upper penetration electrodes 215. A subsequent process may be performed by the same method as described with reference to FIGS. 1 to 4.

Figure 16:
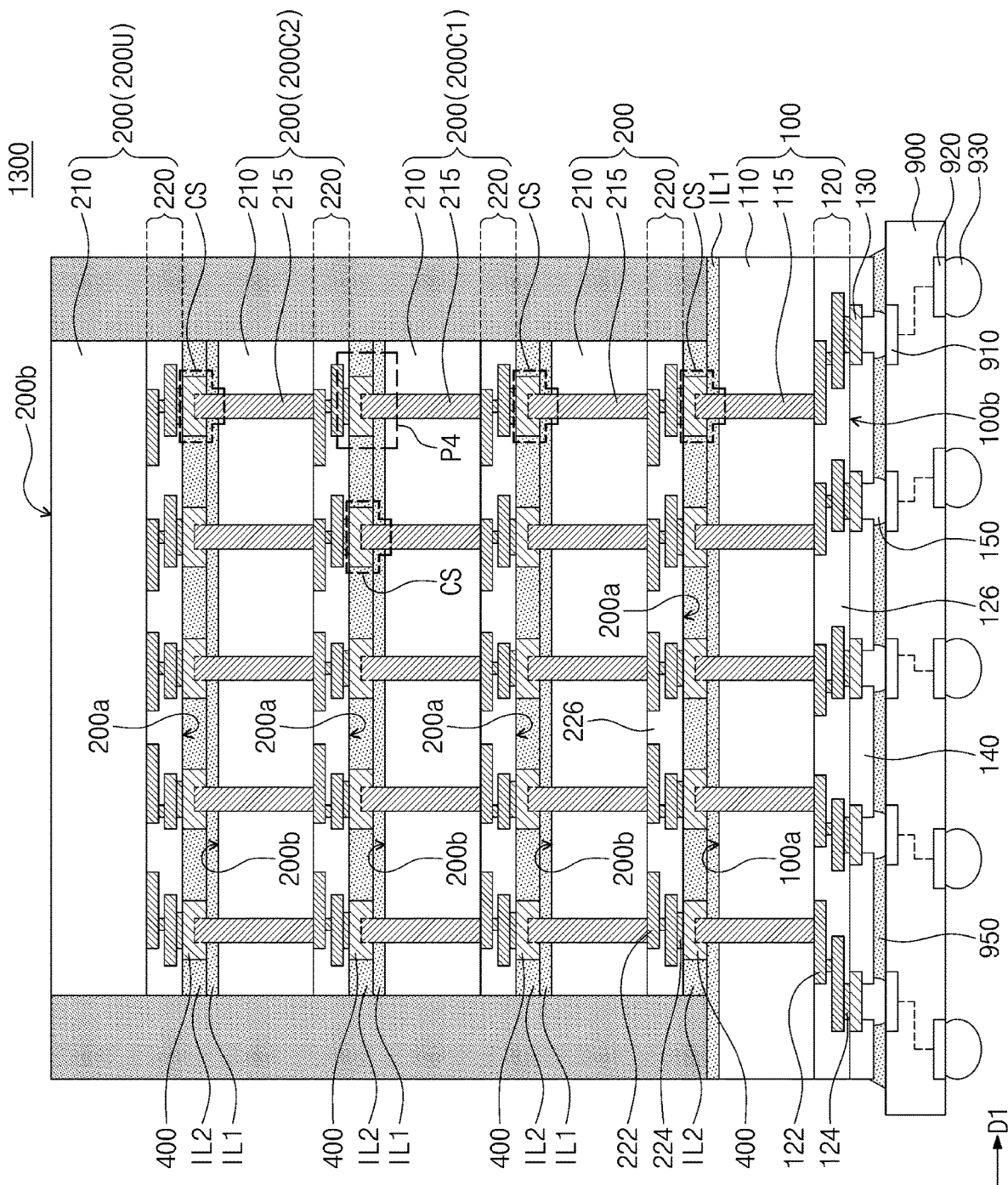
FIG. 16 is a sectional view illustrating a semiconductor package according to an embodiment of the inventive concept.
Figure 17:
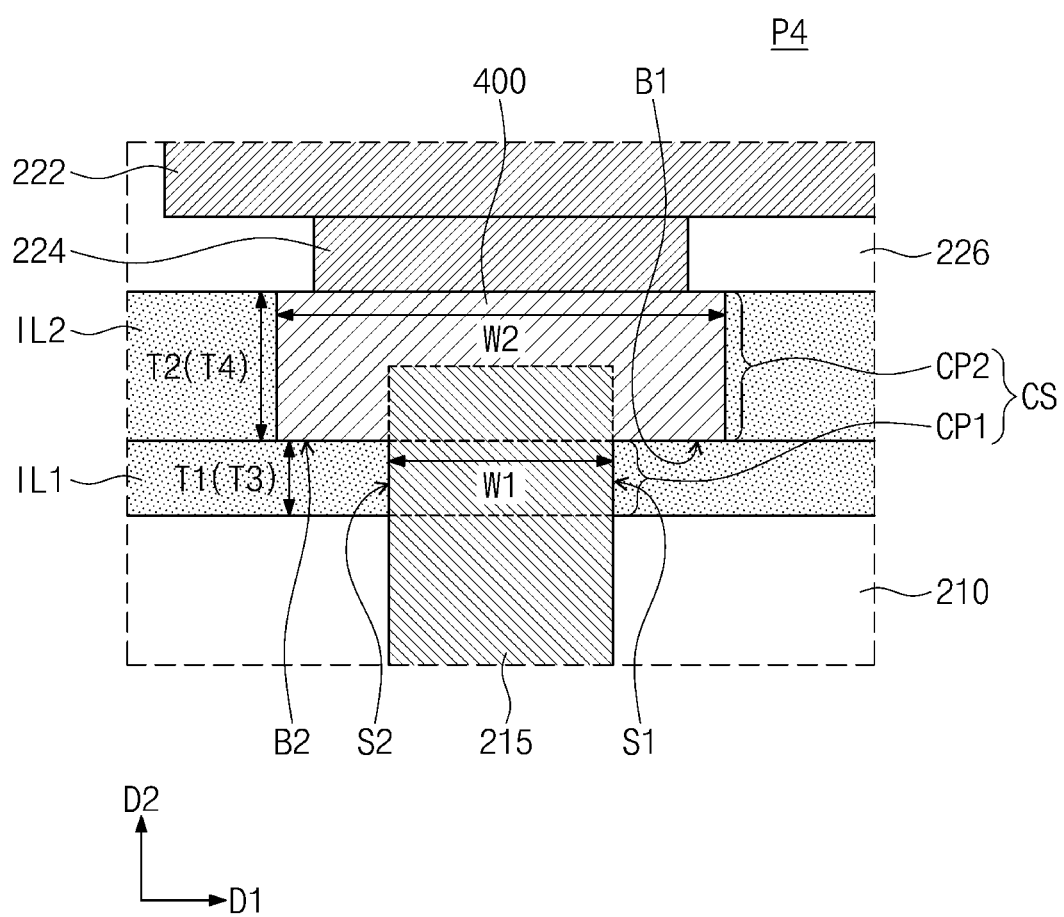
FIG. 17 is an enlarged view illustrating portion P4 of FIG. 16.

FIG. 16 is a sectional view illustrating a semiconductor package according to an embodiment of the inventive concept. FIG. 17 is an enlarged view illustrating portion P4 of FIG. 16. For concise description, features different from the semiconductor package 1100 of FIGS. 5 and 6 will be mainly described.

Referring to FIGS. 16 and 17, a semiconductor package 1300 may include a plurality of upper semiconductor chips 200, which are vertically stacked on a first surface 100a of a lower semiconductor chip 100. The connection structure CS described with reference to FIGS. 5 and 6 may be disposed between the lowermost one of the upper semiconductor chips 200 and the lower semiconductor chip 100, and between the upper semiconductor chips 200.

Each of the upper semiconductor chips 200 may include an upper semiconductor substrate 210, upper penetration electrodes 215 penetrating the upper semiconductor substrate 210, and an upper circuit layer 220. In an embodiment, the topmost one (e.g., 200U) of the upper semiconductor chips 200 does not include the upper penetration electrodes 215, as illustrated in the drawings. Each of the upper semiconductor chips 200 may have a third surface 200a and a fourth surface 200b, which are opposite to each other, and the upper circuit layer 220 may be adjacent to the third surface 200a of each of the upper semiconductor chips 200. Adjacent ones of the upper semiconductor chips 200 may be stacked in such a way that the third surface 200a of one of the adjacent upper semiconductor chips 200 faces the fourth surface 200b of the other of the adjacent upper semiconductor chips 200. The third surface 200a of the lowermost one of the upper semiconductor chips 200 may face the first surface 100a of the lower semiconductor chip 100.

The upper semiconductor chips 200 may include a first upper semiconductor chip 200C1 and a second upper semiconductor chip 200C2, which are adjacent to each other. The fourth surface 200b of the first upper semiconductor chip 200C1 may face the third surface 200a of the second upper semiconductor chip 200C2. A first insulating layer IL1 may be interposed between the first upper semiconductor chip 200C1 and the second upper semiconductor chip 200C2, and a second insulating layer IL2 may be interposed between the first insulating layer IL1 and the second upper semiconductor chip 200C2. Each of the upper penetration electrodes 215 in the first upper semiconductor chip 200C1 may be extended in a second direction D2 to include a portion that protrudes from the fourth surface 200b of the first upper semiconductor chip 200C1. The protruding portion of each of the upper penetration electrodes 215 may penetrate the first insulating layer ILL Connection pads 400 may be disposed on the third surface 200a of the second upper semiconductor chip 200C2 and in the second insulating layer IL2. Each of the connection pads 400 may be connected to a corresponding one of upper interconnection patterns 222 and 224 (e.g., to the upper interconnection pattern 224), which are provided in the upper circuit layer 220 of the second upper semiconductor chip 200C2.

In an embodiment, the upper penetration electrodes 215 may be directly connected to the connection pads 400. The protruding portion of each of the upper penetration electrodes 215 may penetrate the first insulating layer ILL and may include a portion extended into a corresponding one of the connection pads 400. The protruding portion of each of the upper penetration electrodes 215 may be in contact with the corresponding connection pad 400. The protruding portion of each of the upper penetration electrodes 215 and the corresponding connection pad 400 may be collectively referred to as the connection structure CS.

The connection structure CS may include a first connecting portion CP1 and a second connecting portion CP2, which are respectively provided in the first insulating layer IL1 and the second insulating layer IL2. In an embodiment, the first connecting portion CP1 may include a portion of the protruding portion of each of the upper penetration electrodes 215. The second connecting portion CP2 may include the remaining portion of the protruding portion of each of the upper penetration electrodes 215 and the corresponding connection pad 400. Except for the afore-described features, the first and second insulating layers IL1 and IL2 and the connection structure CS in the present embodiment may be substantially the same as the first and second insulating layers IL1 and IL2 and the connection structure CS described with reference to FIGS. 5 and 6.

FIGS. 18 to 21 are sectional views illustrating a method of fabricating a semiconductor package according to an embodiment of the inventive concept. For concise description, features different from the method described with reference to FIGS. 7 to 11 will be mainly described.

Figure 18:
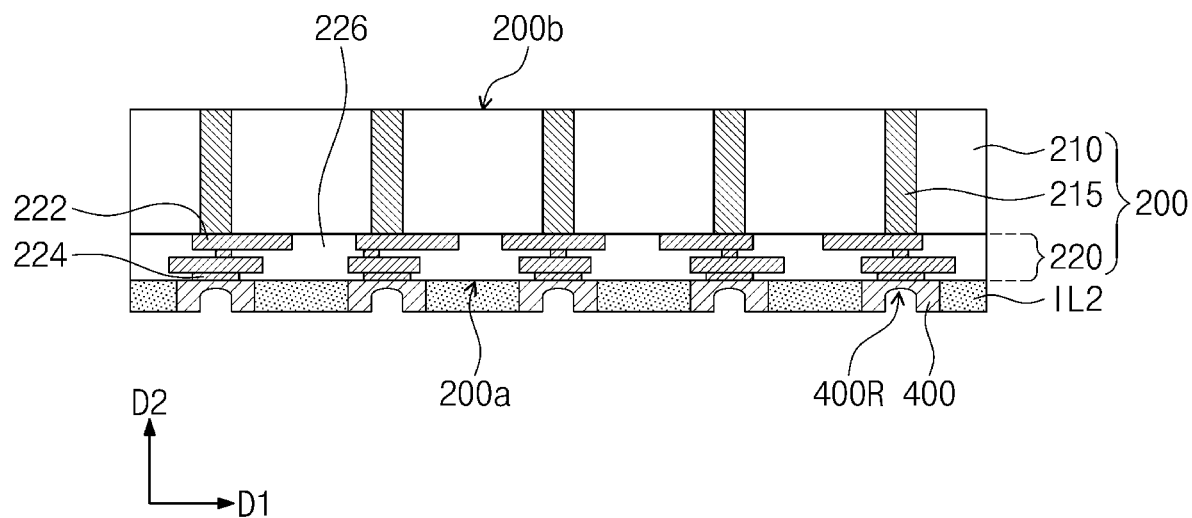
FIGS. 18 to 21 are sectional views illustrating a method of fabricating a semiconductor package according to an embodiment of the inventive concept.

Referring to FIG. 18, an upper semiconductor chip 200 may be provided. The upper semiconductor chip 200 may include an upper semiconductor substrate 210, upper penetration electrodes 215 penetrating the upper semiconductor substrate 210, and an upper circuit layer 220. Each of the upper penetration electrodes 215 may be connected to a corresponding one of upper interconnection patterns 222 and 224 in the upper circuit layer 220 (e.g., to the upper interconnection pattern 224). The upper semiconductor chip 200 may have a third surface 200a and a fourth surface 200b, which are opposite to each other. The upper circuit layer 220 may be adjacent to the third surface 200a of the upper semiconductor chip 200.

Connection pads 400 may be formed on the third surface 200a of the upper semiconductor chip 200. Each of the connection pads 400 may be connected to a corresponding one of the upper interconnection patterns 222 and 224 in the upper circuit layer 220 (e.g., to the upper interconnection pattern 224). Each of the connection pads 400 may be formed to have a recessed region 400R, which is recessed inwardly. A second insulating layer IL2 may be formed on the third surface 200a of the upper semiconductor chip 200 to cover side surfaces of the connection pads 400. The second insulating layer IL2 may expose the recessed region 400R of each of the connection pads 400.

Figure 19:
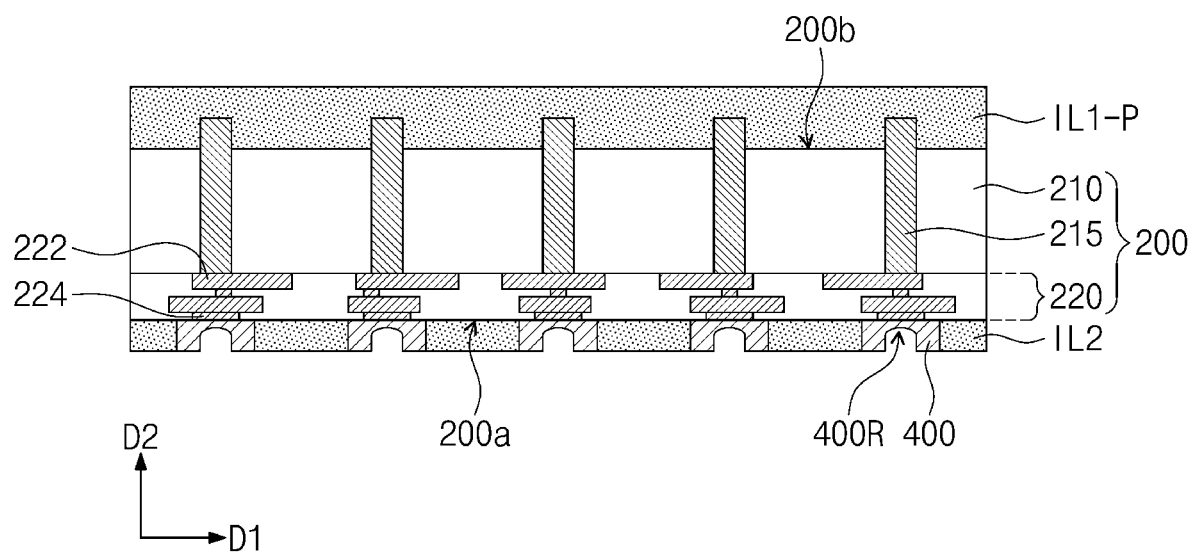

Referring to FIG. 19, a first etching process may be performed on the fourth surface 200b of the upper semiconductor chip 200. The first etching process may be performed to selectively etch a portion of the upper semiconductor substrate 210, and thus, a portion of each of the upper penetration electrodes 215 may protrude from the fourth surface 200b of the upper semiconductor chip 200. A preliminary first insulating layer IL1-P may be formed on the fourth surface 200b of the upper semiconductor chip 200 to cover the protruding portion of each of the upper penetration electrodes 215.

Figure 20:
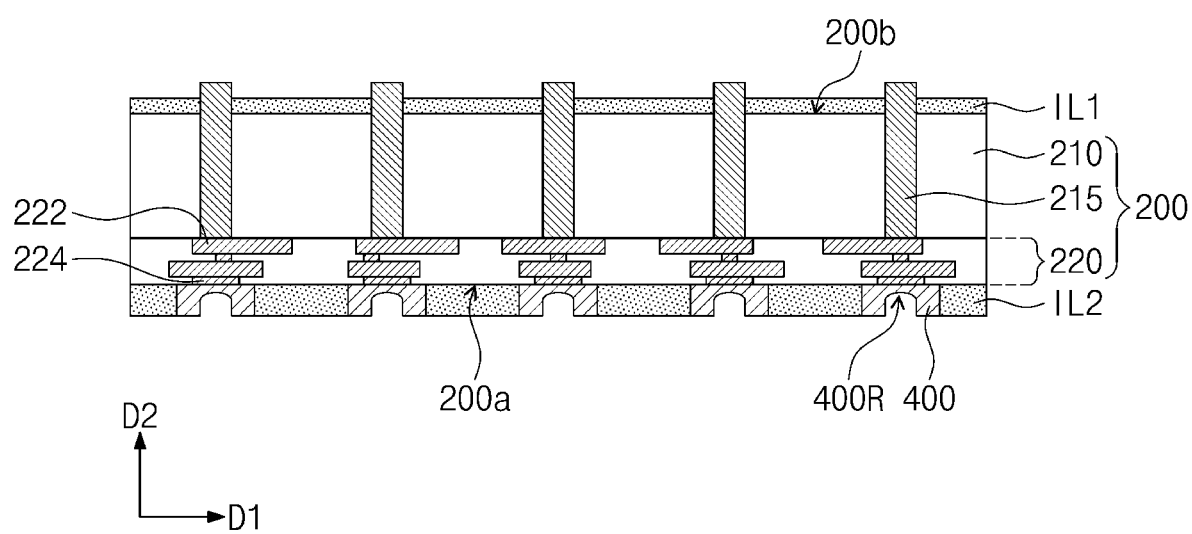

Referring to FIG. 20, a second etching process may be performed on the fourth surface 200b of the upper semiconductor chip 200. The second etching process may be performed to selectively etch a portion of the preliminary first insulating layer IL1-P to form a first insulating layer IL1, and thus, a portion of each of the upper penetration electrodes 215 may protrude from the first insulating layer IL1.

Figure 21:
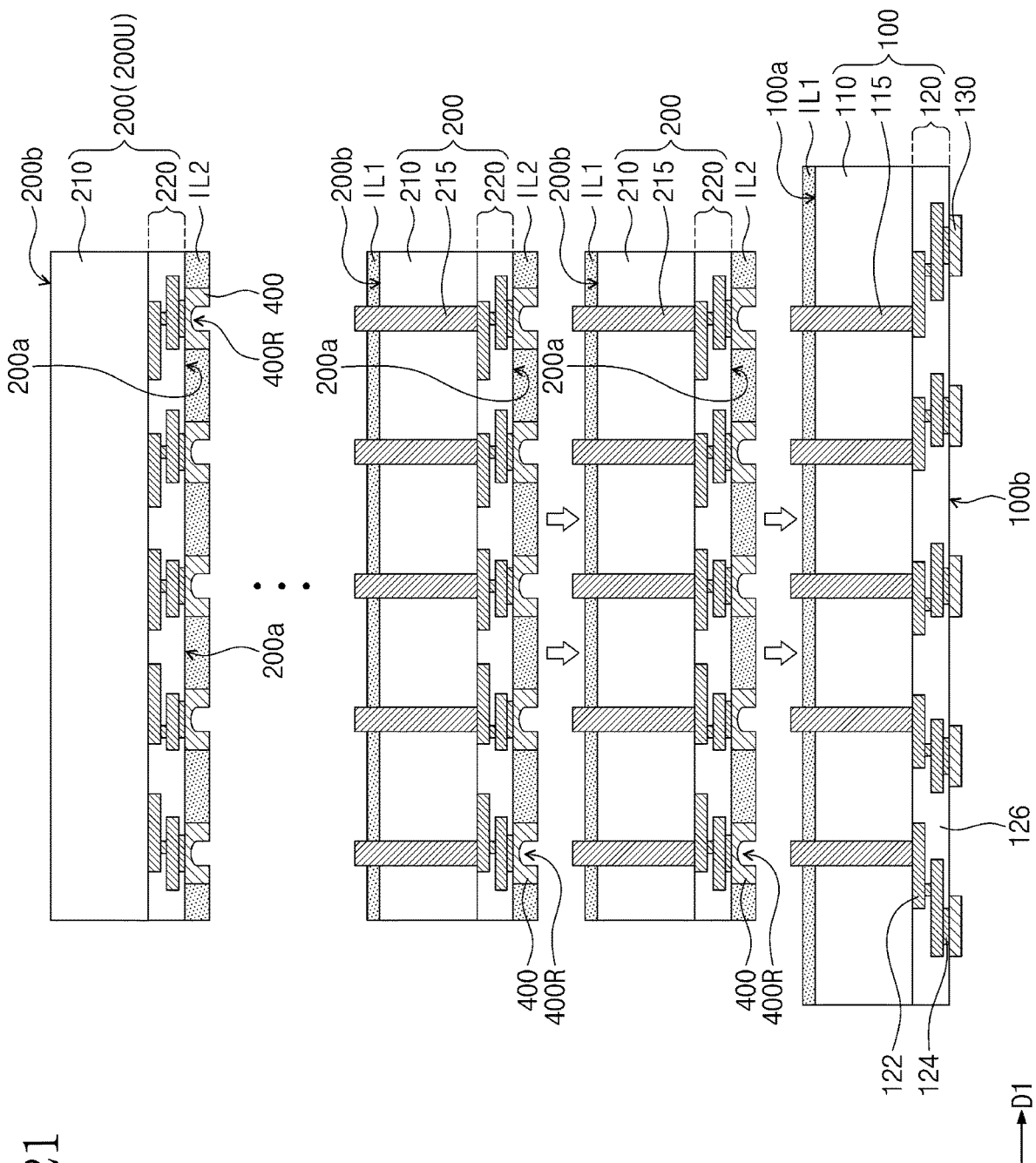

Referring to FIG. 21, a lower semiconductor chip 100 may be provided. The lower semiconductor chip 100 may be formed by substantially the same method as described with reference to FIGS. 7 to 9. The upper semiconductor chip 200 of FIG. 20 may be provided in plural, and the upper semiconductor chips 200 may be vertically stacked on a first surface 100a of the lower semiconductor chip 100. The upper semiconductor chips 200 may be stacked in such a way that the upper penetration electrodes 215 of each upper semiconductor chip 200 are respectively inserted into the recessed regions 400R of the connection pads 400 of another of the upper semiconductor chip 200 which is adjacent to each upper semiconductor chip 200. Lower penetration electrodes 115 protruding from the first surface 100a of the lower semiconductor chip 100 may be respectively inserted into the recessed regions 400R of the connection pads 400 of the lowermost one of the upper semiconductor chips 200.

In an embodiment, the topmost one (e.g., 200U) of the upper semiconductor chips 200 does not include the upper penetration electrodes 215. A subsequent process may be performed by the same method as described with reference to FIGS. 5 to 11.

Figure 22:
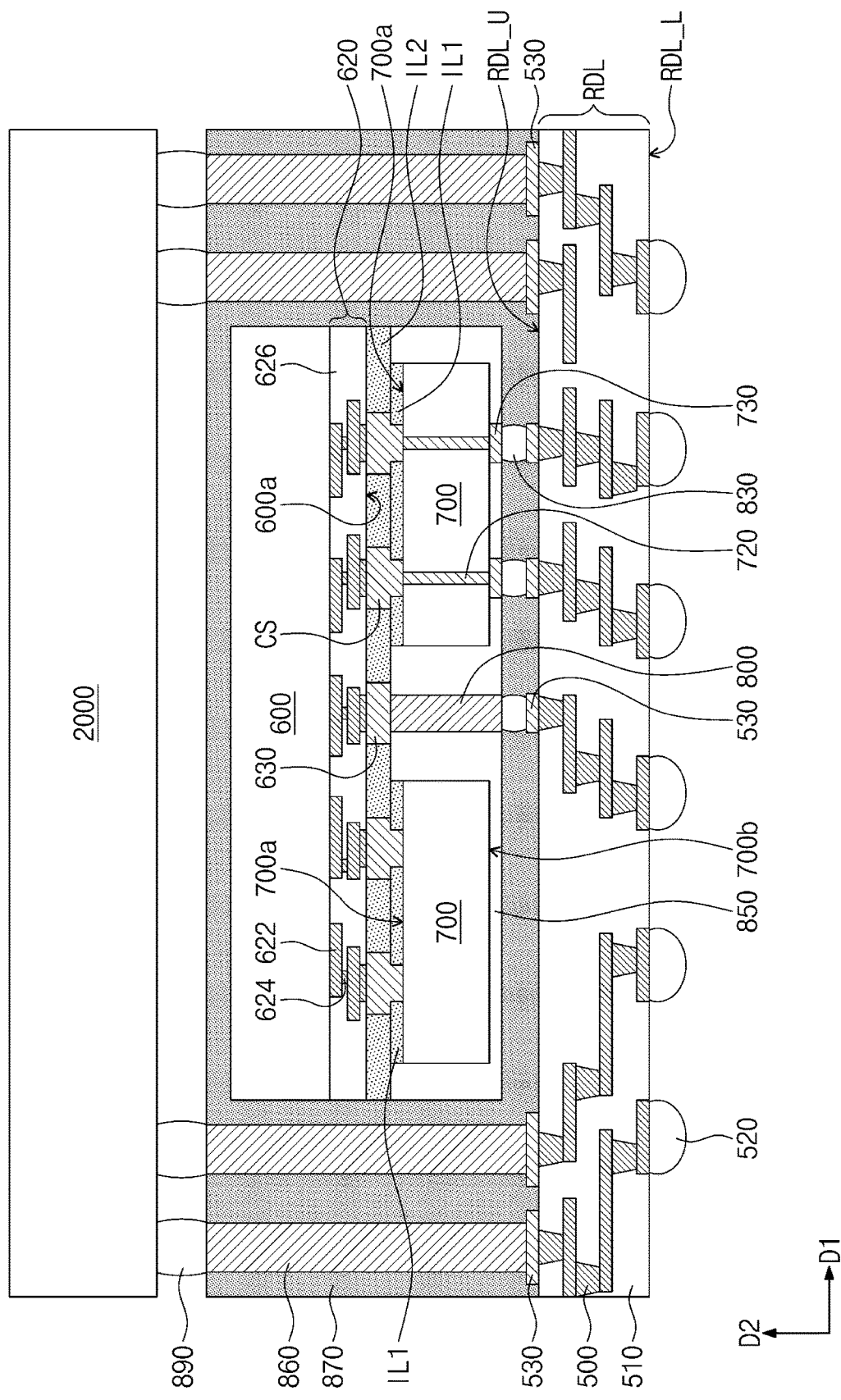
FIG. 22 is a sectional view illustrating a semiconductor package according to an embodiment of the inventive concept.

FIG. 22 is a sectional view illustrating a semiconductor package according to an embodiment of the inventive concept.

Referring to FIG. 22, a first semiconductor chip 600 may be disposed on a redistribution layer RDL. The first semiconductor chip 600 may be disposed in such a way that a first surface 600a of the first semiconductor chip 600 faces a top surface RLD_U of the redistribution layer RDL. The first semiconductor chip 600 may include a first circuit layer 620 adjacent to the first surface 600a, and the first circuit layer 620 may include interconnection patterns 622 and 624 and an interconnection insulating layer 626 covering the interconnection patterns 622 and 624. The interconnection patterns 622 and 624 may be formed of or include at least one of metallic materials (e.g., copper, aluminum, titanium, and/or tungsten), and the interconnection insulating layer 626 may be formed of or include at least one of silicon-containing insulating materials (e.g., silicon oxide, silicon nitride, silicon oxynitride, and/or tetraethyl orthosilicate). The first semiconductor chip 600 may be a memory chip, a logic chip, an application processor (AP) chip, or a system-on-chip (SOC).

The redistribution layer RDL may include redistribution patterns 500 and a redistribution insulating layer 510 covering the redistribution patterns 500. The redistribution patterns 500 may be formed of or include at least one of metallic materials (e.g., copper, aluminum, titanium, and/or tungsten), and the redistribution insulating layer 510 may be formed of or include at least one of photo-sensitive insulating materials.

A second semiconductor chip 700 may be disposed between the redistribution layer RDL and the first semiconductor chip 600. The second semiconductor chip 700 may be disposed in such a way that a second surface 700a of the second semiconductor chip 700 faces the first surface 600a of the first semiconductor chip 600. The second semiconductor chip 700 may be connected to the first surface 600a of the first semiconductor chip 600. In an embodiment, a plurality of second semiconductor chips 700 may be disposed between the redistribution layer RDL and the first semiconductor chip 600. The second semiconductor chips 700 may be disposed on the first surface 600a of the first semiconductor chip 600 and may be horizontally spaced apart from each other in a direction (e.g., a first direction D1) parallel to the first surface 600a. Each of the second semiconductor chips 700 may be connected to the first surface 600a of the first semiconductor chip 600. In an embodiment, the second semiconductor chips 700 may be semiconductor chips of the same kind. As an example, the second semiconductor chips 700 may be memory chips, logic chips, application processor (AP) chips, or system-on-chips (SOCs). In certain embodiments, the second semiconductor chips 700 may be semiconductor chips of different kinds. As an example, the second semiconductor chips 700 may be semiconductor chips of at least two different kinds, which are chosen from memory chips, logic chips, application processor (AP) chips, and system-on-chips (SOCs).

A first insulating layer IL1 may be disposed between the first semiconductor chip 600 and the second semiconductor chip 700, and a second insulating layer IL2 may be disposed between the first insulating layer IL1 and the first semiconductor chip 600. A connection structure CS may penetrate the first and second insulating layers IL1 and IL2 to connect the first and second semiconductor chips 600 and 700 to each other. The first and second insulating layers IL1 and IL2 and the connection structure CS may be substantially the same as the first and second insulating layers IL1 and IL2 and the connection structure CS described with reference to FIGS. 1 and 2. In an embodiment, unlike the illustrated structure, the first and second insulating layers IL1 and IL2 and the connection structure CS may be substantially the same as the first and second insulating layers IL1 and IL2 and the connection structure CS described with reference to FIGS. 5 and 6. The connection structure CS may be connected to a corresponding one of the interconnection patterns 622 and 624 (e.g., to the interconnection pattern 624), which are provided in the first circuit layer 620 of the first semiconductor chip 600.

A first chip pad 630 may be disposed on the first surface 600a of the first semiconductor chip 600. The second insulating layer IL2 may be extended along the first surface 600a of the first semiconductor chip 600 to cover a side surface of the first chip pad 630. The first chip pad 630 may be connected to a corresponding one of the interconnection patterns 622 and 624 (e.g., to the interconnection pattern 624), which are provided in the first circuit layer 620 of the first semiconductor chip 600. The first chip pad 630 may be formed of or include at least one of conductive materials. A first conductive pillar 800 may be disposed between the second semiconductor chips 700 and may be connected to the first chip pad 630. The first conductive pillar 800 may be formed of or include at least one of metallic materials (e.g., copper).

In an embodiment, penetration electrodes 720 may be disposed in at least one of the second semiconductor chips 700, and second chip pads 730 may be disposed on a third surface 700b of at least one of the second semiconductor chips 700. The third surface 700b of the second semiconductor chip 700 may be opposite to the second surface 700a of the second semiconductor chip 700. Each of the penetration electrodes 720 may penetrate at least one of the second semiconductor chips 700 and may be connected to the connection structure CS and a corresponding one of the second chip pads 730. The penetration electrodes 720 may be formed of or include at least one of metallic materials (e.g., copper (Cu)), and the second chip pads 730 may be formed of or include at least one of conductive materials. In an embodiment, the penetration electrodes 720 and the second chip pads 730 are not present in the other of the second semiconductor chips 700, but the inventive concept is not limited to this example.

A first mold layer 850 may be disposed between the redistribution layer RDL and the first semiconductor chip 600 to cover side surfaces of the second semiconductor chips 700 and the first conductive pillar 800. The first mold layer 850 may be extended to a region on the third surface 700b of each of the second semiconductor chips 700 to cover the third surface 700b. The first mold layer 850 may cover a side surface of the second chip pad 730. The first mold layer 850 may be formed of or include at least one of insulating materials (e.g., epoxy molding compounds).

Conductive pads 530 may be disposed on a top surface RDL_U of the redistribution layer RDL. Each of the conductive pads 530 may be connected to at least one of the redistribution patterns 500 corresponding thereto. Each of the first conductive pillar 800 and the second chip pad 730 may be connected to a corresponding one of the conductive pads 530 through a connection bump 830.

The first semiconductor chip 600 may be connected to the redistribution patterns 500 of the redistribution layer RLD through the first conductive pillar 800 and the conductive pad 530 connected thereto. In an embodiment, the first semiconductor chip 600 may be connected to the redistribution patterns 500 of the redistribution layer RLD through the penetration electrodes 720, which are disposed in the at least one of the second semiconductor chips 700, and the conductive pads 530 connected thereto. In an embodiment, the penetration electrodes 720 and the second chip pads 730 are not present in the other of the second semiconductor chips 700, and the other of the second semiconductor chips 700 may be connected to the redistribution patterns 500 of the redistribution layer RLD through the first semiconductor chip 600 and the first conductive pillar 800. Outer terminals 520 may be disposed on a bottom surface RDL_L of the redistribution layer RDL. The conductive pads 530 may be connected to the outer terminals 520 through the redistribution patterns 500.

Second conductive pillars 860 may be disposed on the top surface RDL_U of the redistribution layer RDL. Each of the second conductive pillars 860 may be connected to a corresponding one of the conductive pads 530. The second conductive pillars 860 may be horizontally spaced apart from the first and second semiconductor chips 600 and 700. The second conductive pillars 860 may be formed of or include at least one of metallic materials (e.g., copper). A second mold layer 870 may cover the first and second semiconductor chips 600 and 700, and the second conductive pillars 860. The second mold layer 870 may fill a space between the connection bumps 830. The second mold layer 870 may be formed of or include at least one of insulating materials (e.g., epoxy molding compounds).

Additional bumps 890 may be disposed on the second conductive pillars 860, respectively, and the second conductive pillars 860 may be connected to an upper structure 2000 through the additional bumps 890. The upper structure 2000 may be an interposer substrate, an additional redistribution layer, a semiconductor chip, or a semiconductor package. The upper structure 2000 may be connected to the redistribution patterns 500 of the redistribution layer RDL through the second conductive pillars 860.

According to an embodiment of the inventive concept, a connection structure for interconnection between adjacent semiconductor chips may be easily formed. Accordingly, it may be possible to provide a semiconductor package, in which a plurality of semiconductor chips may be easily connected to each other, and in which higher integration may be easily achieved.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
   a lower semiconductor chip having a first surface and a second surface, which are opposite to each other;
   an upper semiconductor chip on the first surface of the lower semiconductor chip;
   a first insulating layer between the first surface of the lower semiconductor chip and the upper semiconductor chip;
   a second insulating layer between the first insulating layer and the upper semiconductor chip; and
   a connection structure penetrating the first insulating layer and the second insulating layer and being connected to the lower semiconductor chip and the upper semiconductor chip,
   wherein the connection structure comprises a first connecting portion and a second connecting portion, which are respectively disposed in the first insulating layer and the second insulating layer, wherein a lower surface of the first connecting portion vertically overlaps the first surface of the lower semiconductor chip,
wherein the lower surface of the first connecting portion is in direct contact with the first surface of the lower semiconductor chip,
wherein a maximum width of the second connecting portion in a first direction is larger than a maximum width of the first connecting portion in the first direction,
wherein the first direction is parallel to the first surface of the lower semiconductor chip,
wherein the second connecting portion of the connection structure includes a connection pad with a recessed region,
wherein the first connection portion is inserted into the recessed region of the second connection portion,
wherein the first insulating layer is in direct contact with a bottom surface of the second connecting portion and a side surface of the first connecting portion, and
wherein a contact surface between the first insulating layer and the first connecting portion vertically overlaps the first surface of the lower semiconductor chip.

2. The semiconductor package of claim 1,
wherein the first insulating layer is directly bonded to the second insulating layer.

3. The semiconductor package of claim 2,
wherein a thickness of the second insulating layer in a second direction is greater than the thickness of the first insulating layer in the second direction, and
wherein the second direction is perpendicular to the first surface of the lower semiconductor chip.

4. The semiconductor package of claim 1,
wherein the second connecting portion extends onto an upper surface of the first insulating layer in the first direction, and
wherein the first insulating layer is interposed between the bottom surface of the second connecting portion and the first surface of the lower semiconductor chip.

5. The semiconductor package of claim 1,
wherein the first connecting portion has a first side surface and a second side surface, which are opposite to each other in the first direction, and
wherein the second connecting portion extends beyond the first side surface of the first connecting portion in the first direction and extends beyond the second side surface of the first connecting portion in a direction opposite to the first direction.

6. The semiconductor package of claim 5,
wherein the bottom surface of the second connecting portion has a first portion adjacent to the first side surface of the first connecting portion and a second portion adjacent to the second side surface of the first connecting portion, and
wherein the first insulating layer is interposed between the first surface of the lower semiconductor chip and the first portion of the bottom surface of the second connecting portion, and between the first surface of the lower semiconductor chip and the second portion of the bottom surface of the second connecting portion.

7. The semiconductor package of claim 6,
wherein the first insulating layer is in direct contact with the first and second side surfaces of the first connecting portion and the first and second portions of the bottom surface of the second connecting portion.

8. The semiconductor package of claim 1,
wherein the first connecting portion and the second connecting portion are formed of the same material as each other.

9. The semiconductor package of claim 1,
wherein the lower semiconductor chip comprises:
a lower circuit layer adjacent to the second surface of the lower semiconductor chip; and
a plurality of lower penetration electrodes extending from the first surface of the lower semiconductor chip toward the second surface of the lower semiconductor chip such that the plurality of lower penetration electrodes are connected to the lower circuit layer, and
wherein the first connecting portion is connected to a corresponding one of the plurality of lower penetration electrodes.

10. The semiconductor package of claim 9,
wherein the maximum width, in the first direction, of the first connecting portion is larger than a width, in the first direction, of the corresponding one of the plurality of lower penetration electrodes.

11. The semiconductor package of claim 9,
wherein the maximum width, in the first direction, of the first connecting portion is equal to a width of the corresponding one of the plurality of the lower penetration electrodes.

12. The semiconductor package of claim 9,
wherein the upper semiconductor chip has a third surface facing the first surface of the lower semiconductor chip, and
wherein the upper semiconductor chip comprises an upper circuit layer adjacent to the third surface of the upper semiconductor chip.

13. The semiconductor package of claim 12,
wherein the first insulating layer, the second insulating layer, and the connection structure are disposed between the first surface of the lower semiconductor chip and the third surface of the upper semiconductor chip, and
wherein the second connecting portion is connected to a corresponding one of a plurality of upper interconnection patterns in the upper circuit layer of the upper semiconductor chip.

14. A semiconductor package, comprising:
a lower semiconductor chip having a first surface and a second surface, which are opposite to each other;
a plurality of upper semiconductor chips vertically stacked on the first surface of the lower semiconductor chip, the plurality of upper semiconductor chips comprising a first upper semiconductor chip and a second upper semiconductor chip, which are adjacent to each other;
a first insulating layer between the first upper semiconductor chip and the second upper semiconductor chip;
a second insulating layer between the first insulating layer and the second upper semiconductor chip; and
a connection structure penetrating the first and second insulating layers and being connected to the first and second upper semiconductor chips,
wherein the connection structure comprises a first connecting portion in the first insulating layer and a second connecting portion in the second insulating layer,
wherein a lower surface of the first connection portion vertically overlaps a third surface of the first upper semiconductor chip, wherein the lower surface of the first connecting portion is in direct contact with the third surface of the first upper semiconductor chip, wherein a maximum width, in a first direction, of the second connecting portion is larger than a maximum width, in the first direction, of the first connecting portion, wherein the second connecting portion of the connection structure includes a connection pad with a recessed region, wherein the first connection portion is inserted into the recessed region of the second connection portion, and wherein the first insulating layer is in direct contact with a bottom surface of the second connecting portion and a side surface of the first connecting portion, and wherein a contact surface between the first insulating layer and the first connecting portion vertically overlaps the third surface of the first upper semiconductor chip.

15. The semiconductor package of claim 14, wherein the first insulating layer is directly bonded to the second insulating layer, wherein a thickness, in a second direction, of the second connecting portion is larger than a thickness, in the second direction, of the first connecting portion, and wherein the first direction is parallel to the first surface of the lower semiconductor chip and the second direction is perpendicular to the first surface of the lower semiconductor chip.

16. The semiconductor package of claim 14, wherein the second connecting portion extends onto an upper surface of the first insulating layer in the first direction, and wherein the first insulating layer is interposed between the bottom surface of the second connecting portion and the first upper semiconductor chip.

17. The semiconductor package of claim 14, wherein each of the first and second upper semiconductor chips has the third surface and a fourth surface, which are opposite to each other, wherein each of the first and second upper semiconductor chips has an upper circuit layer adjacent to the fourth surface, and wherein the first insulating layer, the second insulating layer, and the connection structure are disposed between the third surface of the first upper semiconductor chip and the fourth surface of the second upper semiconductor chip.

18. The semiconductor package of claim 17, wherein the first upper semiconductor chip comprises an upper penetration electrode, which extends from the third surface of the first upper semiconductor chip toward the fourth surface thereof to be connected to the upper circuit layer of the first upper semiconductor chip, wherein the first connecting portion is connected to the upper penetration electrode of the first upper semiconductor chip, and wherein the second connecting portion is connected to an upper interconnection line pattern in the upper circuit layer of the second upper semiconductor chip.

* * * * *